(12) United States Patent
Ahn et al.

(10) Patent No.: US 7,405,454 B2
(45) Date of Patent: Jul. 29, 2008

(54) ELECTRONIC APPARATUS WITH DEPOSITED DIELECTRIC LAYERS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/213,013

(22) Filed: Aug. 26, 2005

(65) Prior Publication Data

US 2006/0001151 A1 Jan. 5, 2006

Related U.S. Application Data

(62) Division of application No. 10/379,470, filed on Mar. 4, 2003, now Pat. No. 7,192,892.

(51) Int. Cl.
*H01L 29/76* (2006.01)

(52) U.S. Cl. .................. 257/410; 257/411; 257/506

(58) Field of Classification Search ............ 257/410, 257/411, 506
See application file for complete search history.

(56) References Cited

U.S. PATENT DOCUMENTS

| 2,501,563 | A | 3/1950 | Colbert et al. |
| 3,357,961 | A | 12/1967 | Makowski et al. |
| 3,478,230 | A | 11/1969 | Otter et al. |
| 3,506,438 | A | 4/1970 | Krock et al. |
| 3,676,718 | A | 7/1972 | Anderson et al. |
| 3,738,817 | A | 6/1973 | Benjamin |
| 3,816,673 | A | 6/1974 | Miya |
| 3,833,386 | A | 9/1974 | Wood et al. |
| 3,903,232 | A | 9/1975 | Wood et al. |
| 3,926,568 | A | 12/1975 | Benjamin et al. |
| 3,953,566 | A | 4/1976 | Gore |
| 3,956,195 | A | 5/1976 | Topchiashvili et al. |
| 3,959,191 | A | 5/1976 | Kehr et al. |
| 3,962,153 | A | 6/1976 | Gore |
| 4,017,322 | A | 4/1977 | Kawai et al. |

(Continued)

FOREIGN PATENT DOCUMENTS

EP 578856 A1 7/1992

(Continued)

OTHER PUBLICATIONS

"International Search Report, for Application No. PCT/US2004/006685, date mailed Nov. 23, 2004", 77 pages.

(Continued)

*Primary Examiner*—Douglas M. Menz
(74) *Attorney, Agent, or Firm*—Schwegman, Lundberg & Woessner, P.A.

(57) ABSTRACT

An atomic layer deposited dielectric layer and a method of fabricating such a dielectric layer produce a reliable dielectric layer having an equivalent oxide thickness thinner than attainable using $SiO_2$. Depositing a hafnium metal layer on a substrate surface by atomic layer deposition and depositing a hafnium oxide layer on the hafnium metal layer by atomic layer deposition form a hafnium oxide dielectric layer substantially free of silicon oxide. Dielectric layers containing atomic layer deposited hafnium oxide are thermodynamically stable such that the hafnium oxide will have minimal reactions with a silicon substrate or other structures during processing.

28 Claims, 8 Drawing Sheets

U.S. PATENT DOCUMENTS

| | | |
|---|---|---|
| 4,058,430 A | 11/1977 | Suntola et al. |
| 4,096,227 A | 6/1978 | Gore |
| 4,137,200 A | 1/1979 | Wood et al. |
| 4,215,156 A | 7/1980 | Dalal et al. |
| 4,293,679 A | 10/1981 | Cogliano |
| 4,302,620 A | 11/1981 | Chu |
| 4,308,421 A | 12/1981 | Bogese, II |
| 4,333,808 A | 6/1982 | Bhattacharyya et al. |
| 4,358,397 A | 11/1982 | Chu |
| 4,368,350 A | 1/1983 | Perelman |
| 4,372,032 A | 2/1983 | Collins et al. |
| 4,394,673 A | 7/1983 | Thompson et al. |
| 4,399,424 A | 8/1983 | Rigby |
| 4,403,083 A | 9/1983 | Marans et al. |
| 4,413,022 A | 11/1983 | Suntola et al. |
| 4,482,516 A | 11/1984 | Bowman et al. |
| 4,640,871 A | 2/1987 | Hayashi et al. |
| 4,647,947 A | 3/1987 | Takeoka et al. |
| 4,725,877 A | 2/1988 | Brasen et al. |
| 4,749,888 A | 6/1988 | Sakai et al. |
| 4,902,533 A | 2/1990 | White et al. |
| 4,920,071 A | 4/1990 | Thomas |
| 4,933,743 A | 6/1990 | Thomas et al. |
| 4,940,636 A | 7/1990 | Brock et al. |
| 4,961,004 A | 10/1990 | Bryan et al. |
| 4,962,058 A | 10/1990 | Cronin et al. |
| 4,962,476 A | 10/1990 | Kawada |
| 4,963,753 A | 10/1990 | Bryan et al. |
| 4,963,754 A | 10/1990 | Bryan et al. |
| 4,967,085 A | 10/1990 | Bryan et al. |
| 4,967,087 A | 10/1990 | Bryan et al. |
| 4,972,086 A | 11/1990 | Bryan et al. |
| 4,972,516 A | 11/1990 | Bryan et al. |
| 4,975,014 A | 12/1990 | Rufin et al. |
| 4,975,588 A | 12/1990 | Bryan et al. |
| 4,980,559 A | 12/1990 | Bryan et al. |
| 4,980,560 A | 12/1990 | Bryan et al. |
| 4,983,847 A | 1/1991 | Bryan et al. |
| 4,988,880 A | 1/1991 | Bryan et al. |
| 4,990,282 A | 2/1991 | Bryan et al. |
| 4,992,205 A | 2/1991 | Bryan et al. |
| 4,994,205 A | 2/1991 | Bryan et al. |
| 4,996,003 A | 2/1991 | Bryan et al. |
| 5,008,034 A | 4/1991 | Bryan et al. |
| 5,017,791 A | 5/1991 | Bryan et al. |
| 5,019,728 A | 5/1991 | Sanwo et al. |
| 5,032,545 A | 7/1991 | Doan et al. |
| 5,055,319 A | 10/1991 | Bunshah et al. |
| 5,075,536 A | 12/1991 | Towe et al. |
| 5,080,928 A | 1/1992 | Klinedinst et al. |
| 5,084,606 A | 1/1992 | Bailey et al. |
| 5,089,084 A | 2/1992 | Chhabra et al. |
| 5,095,218 A | 3/1992 | Bryan et al. |
| 5,103,288 A | 4/1992 | Sakamoto et al. |
| 5,128,382 A | 7/1992 | Elliott, Jr. et al. |
| 5,128,962 A | 7/1992 | Kerslake et al. |
| 5,135,889 A | 8/1992 | Allen |
| 5,137,780 A | 8/1992 | Nichols et al. |
| 5,158,986 A | 10/1992 | Cha et al. |
| 5,158,989 A | 10/1992 | Ogitani et al. |
| 5,165,046 A | 11/1992 | Hesson |
| 5,171,713 A | 12/1992 | Matthews |
| 5,173,442 A | 12/1992 | Carey |
| 5,191,404 A | 3/1993 | Wu et al. |
| 5,198,029 A | 3/1993 | Dutta et al. |
| 5,223,808 A | 6/1993 | Lee et al. |
| 5,274,249 A | 12/1993 | Xi et al. |
| 5,302,461 A | 4/1994 | Anthony |
| 5,303,555 A | 4/1994 | Chrysler et al. |
| 5,324,683 A | 6/1994 | Fitch et al. |
| 5,334,356 A | 8/1994 | Baldwin et al. |
| 5,340,843 A | 8/1994 | Tsuruta et al. |
| 5,352,998 A | 10/1994 | Tanino |
| 5,363,550 A | 11/1994 | Aitken et al. |
| 5,408,742 A | 4/1995 | Zaidel et al. |
| 5,438,539 A | 8/1995 | Mori |
| 5,449,427 A | 9/1995 | Wojnarowski et al. |
| 5,450,026 A | 9/1995 | Morano |
| 5,461,003 A | 10/1995 | Havemann et al. |
| 5,470,802 A | 11/1995 | Gnade et al. |
| 5,473,814 A | 12/1995 | White |
| 5,480,048 A | 1/1996 | Kitamura et al. |
| 5,486,493 A | 1/1996 | Jeng |
| 5,510,645 A | 4/1996 | Fitch et al. |
| 5,510,758 A | 4/1996 | Fujita et al. |
| 5,521,536 A | 5/1996 | Yamashita et al. |
| 5,552,638 A | 9/1996 | O'Connor et al. |
| 5,554,305 A | 9/1996 | Wojnarowski et al. |
| 5,554,870 A | 9/1996 | Fitch et al. |
| 5,562,952 A | 10/1996 | Nakahigashi et al. |
| 5,572,052 A | 11/1996 | Kashihara et al. |
| 5,587,609 A | 12/1996 | Murakami et al. |
| 5,593,926 A | 1/1997 | Fujihira |
| 5,619,159 A | 4/1997 | Sasaki et al. |
| 5,621,681 A | 4/1997 | Moon |
| 5,625,233 A | 4/1997 | Cabral, Jr. et al. |
| 5,646,583 A | 7/1997 | Seabury et al. |
| 5,656,548 A | 8/1997 | Zavracky et al. |
| 5,673,561 A | 10/1997 | Moss |
| 5,674,563 A | 10/1997 | Tarui et al. |
| 5,674,574 A | 10/1997 | Atwell et al. |
| 5,698,022 A | 12/1997 | Glassman et al. |
| 5,701,666 A | 12/1997 | DeHaven et al. |
| 5,714,336 A | 2/1998 | Simons et al. |
| 5,714,766 A | 2/1998 | Chen et al. |
| 5,729,047 A | 3/1998 | Ma |
| 5,735,960 A | 4/1998 | Sandhu et al. |
| 5,744,374 A | 4/1998 | Moon |
| 5,745,334 A | 4/1998 | Hoffarth et al. |
| 5,747,880 A | 5/1998 | Havemann et al. |
| 5,751,021 A | 5/1998 | Teraguchi |
| 5,756,404 A | 5/1998 | Friedenreich et al. |
| 5,765,214 A | 6/1998 | Sywyk |
| 5,772,153 A | 6/1998 | Abaunza et al. |
| 5,785,787 A | 7/1998 | Wojnarowski et al. |
| 5,786,630 A | 7/1998 | Bhansali et al. |
| 5,789,030 A | 8/1998 | Rolfson |
| 5,795,808 A | 8/1998 | Park |
| 5,798,200 A | 8/1998 | Matsuura et al. |
| 5,801,105 A | 9/1998 | Yano et al. |
| 5,804,607 A | 9/1998 | Hedrick et al. |
| 5,810,923 A | 9/1998 | Yano et al. |
| 5,811,984 A | 9/1998 | Long et al. |
| 5,821,621 A | 10/1998 | Jeng |
| 5,822,256 A | 10/1998 | Bauer et al. |
| 5,827,571 A | 10/1998 | Lee et al. |
| 5,828,080 A | 10/1998 | Yano et al. |
| 5,840,897 A | 11/1998 | Kirlin et al. |
| 5,841,075 A | 11/1998 | Hanson |
| 5,844,317 A | 12/1998 | Bertolet et al. |
| 5,864,923 A | 2/1999 | Rouanet et al. |
| 5,878,314 A | 3/1999 | Takaya et al. |
| 5,879,459 A | 3/1999 | Gadgil et al. |
| 5,879,787 A | 3/1999 | Petefish |
| 5,879,794 A | 3/1999 | Korleski |
| 5,880,601 A | 3/1999 | Kanazawa et al. |
| 5,891,797 A | 4/1999 | Farrar |
| 5,910,684 A | 6/1999 | Sandhu et al. |
| 5,912,313 A | 6/1999 | McIntosh et al. |
| 5,912,797 A | 6/1999 | Schneemeyer et al. |
| 5,916,365 A | 6/1999 | Sherman |
| 5,923,056 A | 7/1999 | Lee et al. |
| 5,953,626 A | 9/1999 | Hause et al. |
| 5,962,959 A | 10/1999 | Iwasaki et al. |

| | | | | | | |
|---|---|---|---|---|---|---|
| 5,963,833 | A | 10/1999 | Thakur | 6,255,712 B1 | 7/2001 | Clevenger et al. |
| 5,972,847 | A | 10/1999 | Feenstra et al. | 6,255,852 B1 | 7/2001 | Forbes et al. |
| 5,981,350 | A | 11/1999 | Geusic et al. | 6,258,637 B1 | 7/2001 | Wilk et al. |
| 5,990,605 | A | 11/1999 | Yoshikawa et al. | 6,259,198 B1 | 7/2001 | Yanagisawa et al. |
| 5,994,240 | A | 11/1999 | Thakur | 6,273,951 B1 | 8/2001 | Vaartstra |
| 5,994,777 | A | 11/1999 | Farrar | 6,274,937 B1 | 8/2001 | Ahn et al. |
| 5,998,528 | A | 12/1999 | Tsipursky et al. | 6,278,230 B1 | 8/2001 | Yoshizawa et al. |
| 6,010,969 | A | 1/2000 | Vaarstra | 6,281,042 B1 | 8/2001 | Ahn et al. |
| 6,013,553 | A | 1/2000 | Wallace et al. | 6,285,123 B1 | 9/2001 | Yamada et al. |
| 6,020,024 | A | 2/2000 | Maiti et al. | 6,287,979 B1 | 9/2001 | Zhou et al. |
| 6,020,243 | A | 2/2000 | Wallace et al. | 6,291,341 B1 | 9/2001 | Sharan et al. |
| 6,022,787 | A | 2/2000 | Ma | 6,291,866 B1 | 9/2001 | Wallace et al. |
| 6,023,124 | A | 2/2000 | Chuman et al. | 6,294,813 B1 | 9/2001 | Forbes et al. |
| 6,023,125 | A | 2/2000 | Yoshikawa et al. | 6,296,943 B1 | 10/2001 | Watanabe |
| 6,025,225 | A | 2/2000 | Forbes et al. | 6,297,103 B1 | 10/2001 | Ahn et al. |
| 6,025,627 | A | 2/2000 | Forbes et al. | 6,297,516 B1 | 10/2001 | Forrest et al. |
| 6,027,961 | A | 2/2000 | Maiti et al. | 6,297,539 B1 | 10/2001 | Ma et al. |
| 6,037,245 | A | 3/2000 | Matsuda | 6,300,203 B1 | 10/2001 | Buynoski et al. |
| 6,040,243 | A | 3/2000 | Li et al. | 6,303,481 B2 | 10/2001 | Park |
| 6,043,146 | A | 3/2000 | Watanabe et al. | 6,303,500 B1 | 10/2001 | Jiang et al. |
| 6,057,271 | A | 5/2000 | Kenjiro et al. | 6,313,035 B1 | 11/2001 | Sandhu et al. |
| 6,060,755 | A | 5/2000 | Ma et al. | 6,313,046 B1 | 11/2001 | Juengling et al. |
| 6,063,705 | A | 5/2000 | Vaartstra | 6,313,531 B1 | 11/2001 | Geusic et al. |
| 6,066,922 | A | 5/2000 | Iwasaki | 6,316,873 B1 | 11/2001 | Ito et al. |
| 6,075,383 | A | 6/2000 | Terletzki | 6,317,357 B1 | 11/2001 | Forbes |
| 6,077,792 | A | 6/2000 | Farrar | 6,320,091 B1 | 11/2001 | Ebbinghaus et al. |
| 6,090,636 | A | 7/2000 | Geusic et al. | 6,331,465 B1 | 12/2001 | Forbes et al. |
| 6,103,419 | A | 8/2000 | Saidi et al. | 6,333,556 B1 | 12/2001 | Juengling et al. |
| 6,110,529 | A | 8/2000 | Gardiner et al. | 6,337,805 B1 | 1/2002 | Forbes et al. |
| 6,114,252 | A | 9/2000 | Donohoe et al. | 6,342,445 B1 | 1/2002 | Marsh |
| 6,115,401 | A | 9/2000 | Scobey et al. | 6,342,454 B1 | 1/2002 | Hawker et al. |
| 6,120,531 | A | 9/2000 | Zhou et al. | 6,346,477 B1 | 2/2002 | Kaloyeros et al. |
| 6,127,287 | A | 10/2000 | Hurley et al. | 6,348,386 B1 | 2/2002 | Gilmer |
| 6,130,503 | A | 10/2000 | Negishi et al. | 6,350,649 B1 | 2/2002 | Jeong et al. |
| 6,133,621 | A | 10/2000 | Gaibotti et al. | 6,350,672 B1 | 2/2002 | Sun |
| 6,134,175 | A | 10/2000 | Forbes et al. | 6,350,704 B1 | 2/2002 | Ahn et al. |
| 6,137,025 | A | 10/2000 | Ebbinghaus et al. | 6,352,818 B1 | 3/2002 | Hsieh |
| 6,140,200 | A | 10/2000 | Eldridge | 6,355,561 B1 | 3/2002 | Sandhu et al. |
| 6,141,238 | A | 10/2000 | Forbes et al. | 6,365,470 B1 | 4/2002 | Maeda |
| 6,143,616 | A | 11/2000 | Geusic et al. | 6,365,519 B2 | 4/2002 | Kraus et al. |
| 6,144,155 | A | 11/2000 | Yoshikawa et al. | 6,368,398 B2 | 4/2002 | Vaartstra |
| 6,147,443 | A | 11/2000 | Yoshikawa et al. | 6,368,518 B1 | 4/2002 | Vaartstra |
| 6,150,188 | A | 11/2000 | Geusic et al. | 6,368,941 B1 | 4/2002 | Chen et al. |
| 6,154,280 | A | 11/2000 | Borden | 6,373,740 B1 | 4/2002 | Forbes et al. |
| 6,162,712 | A | 12/2000 | Baum et al. | 6,380,294 B1 | 4/2002 | Babinec et al. |
| 6,165,890 | A | 12/2000 | Kohl et al. | 6,380,579 B1 | 4/2002 | Nam et al. |
| 6,166,487 | A | 12/2000 | Negishi et al. | 6,381,168 B2 | 4/2002 | Forbes |
| 6,171,900 | B1 | 1/2001 | Sun | 6,387,712 B1 | 5/2002 | Yano et al. |
| 6,174,809 | B1 | 1/2001 | Kang et al. | 6,388,376 B1 | 5/2002 | Negishi et al. |
| 6,184,146 | B1 | 2/2001 | Donohoe et al. | 6,391,769 B1 | 5/2002 | Lee et al. |
| 6,184,612 | B1 | 2/2001 | Negishi et al. | 6,399,979 B1 | 6/2002 | Noble et al. |
| 6,187,484 | B1 | 2/2001 | Glass et al. | 6,400,070 B1 | 6/2002 | Yamada et al. |
| 6,191,448 | B1 | 2/2001 | Forbes et al. | 6,404,027 B1 | 6/2002 | Hong et al. |
| 6,191,470 | B1 | 2/2001 | Forbes et al. | 6,404,124 B1 | 6/2002 | Sakemura et al. |
| 6,194,237 | B1 | 2/2001 | Kim et al. | 6,413,827 B2 | 7/2002 | Farrar |
| 6,195,156 | B1 | 2/2001 | Miyammoto et al. | 6,414,476 B2 | 7/2002 | Yagi |
| 6,198,168 | B1 | 3/2001 | Geusic et al. | 6,418,050 B2 | 7/2002 | Forbes |
| 6,200,893 | B1 | 3/2001 | Sneh | 6,420,230 B1 | 7/2002 | Derderian et al. |
| 6,203,613 | B1 | 3/2001 | Gates et al. | 6,420,261 B2 | 7/2002 | Kudo |
| 6,203,726 | B1 | 3/2001 | Danielson et al. | 6,420,262 B1 | 7/2002 | Farrar |
| 6,207,589 | B1 | 3/2001 | Ma et al. | 6,420,279 B1 | 7/2002 | Ono et al. |
| 6,211,035 | B1 | 4/2001 | Moise et al. | 6,420,778 B1 | 7/2002 | Sinyansky |
| 6,212,314 | B1 | 4/2001 | Ford | 6,429,065 B2 | 8/2002 | Forbes |
| 6,217,645 | B1 | 4/2001 | Vaartstra | 6,429,237 B1 | 8/2002 | Tooley |
| 6,218,293 | B1 | 4/2001 | Kraus et al. | 6,432,779 B1 | 8/2002 | Hobbs et al. |
| 6,218,449 | B1 | 4/2001 | Planche et al. | 6,433,408 B1 | 8/2002 | Anjo et al. |
| 6,224,690 | B1 | 5/2001 | Andricacos et al. | 6,433,413 B1 | 8/2002 | Farrar |
| 6,225,168 | B1 | 5/2001 | Gardner et al. | 6,434,041 B2 | 8/2002 | Forbes |
| 6,225,237 | B1 | 5/2001 | Vaartstra | 6,436,799 B1 | 8/2002 | Ramkumar et al. |
| 6,226,599 | B1 | 5/2001 | Namiki | 6,441,417 B1 | 8/2002 | Zhang et al. |
| 6,232,847 | B1 | 5/2001 | Marcy et al. | 6,444,592 B1 | 9/2002 | Ballantine et al. |
| 6,245,658 | B1 | 6/2001 | Buynoski | 6,444,895 B1 | 9/2002 | Nikawa |
| 6,249,460 | B1 | 6/2001 | Forbes et al. | 6,445,023 B1 | 9/2002 | Vaartstra et al. |

| | | |
|---|---|---|
| 6,448,192 B1 | 9/2002 | Kaushik |
| 6,451,641 B1 | 9/2002 | Halliyal et al. |
| 6,451,662 B1 | 9/2002 | Chudzik et al. |
| 6,451,695 B2 | 9/2002 | Sneh |
| 6,454,912 B1 | 9/2002 | Ahn et al. |
| 6,455,717 B1 | 9/2002 | Vaartstra |
| 6,456,535 B2 | 9/2002 | Forbes et al. |
| 6,458,701 B1 | 10/2002 | Chae et al. |
| 6,461,436 B1 | 10/2002 | Campbell et al. |
| 6,461,914 B1 | 10/2002 | Roberts et al. |
| 6,461,970 B1 | 10/2002 | Yin |
| 6,465,298 B2 | 10/2002 | Forbes et al. |
| 6,465,334 B1 | 10/2002 | Buynoski et al. |
| 6,472,321 B2 | 10/2002 | Srinivasan et al. |
| 6,472,803 B1 | 10/2002 | Yoshizawa et al. |
| 6,476,434 B1 | 11/2002 | Noble et al. |
| 6,482,740 B2 | 11/2002 | Soininen et al. |
| 6,486,027 B1 | 11/2002 | Noble et al. |
| 6,486,703 B2 | 11/2002 | Noble et al. |
| 6,489,648 B2 | 12/2002 | Iwasaki et al. |
| 6,492,233 B2 | 12/2002 | Forbes et al. |
| 6,492,288 B2 | 12/2002 | Shindo |
| 6,495,436 B2 | 12/2002 | Ahn et al. |
| 6,498,063 B1 | 12/2002 | Ping |
| 6,498,065 B1 | 12/2002 | Forbes et al. |
| 6,503,818 B1 | 1/2003 | Jang |
| 6,506,666 B2 | 1/2003 | Marsh |
| 6,509,280 B2 | 1/2003 | Choi |
| 6,514,348 B2 | 2/2003 | Miyamoto |
| 6,514,820 B2 | 2/2003 | Ahn et al. |
| 6,514,828 B2 | 2/2003 | Ahn et al. |
| 6,515,510 B2 | 2/2003 | Noble et al. |
| 6,518,610 B2 | 2/2003 | Yang et al. |
| 6,518,615 B1 | 2/2003 | Geusic et al. |
| 6,518,634 B1 | 2/2003 | Kaushik et al. |
| 6,521,911 B2 | 2/2003 | Parsons et al. |
| 6,524,867 B2 | 2/2003 | Yang et al. |
| 6,524,901 B1 | 2/2003 | Trivedi |
| 6,526,191 B1 | 2/2003 | Geusic et al. |
| 6,527,866 B1 | 3/2003 | Matijasevic et al. |
| 6,531,354 B2 | 3/2003 | Maria et al. |
| 6,534,357 B1 | 3/2003 | Basceri |
| 6,534,420 B2 | 3/2003 | Ahn et al. |
| 6,537,613 B1 | 3/2003 | Senzaki et al. |
| 6,538,330 B1 | 3/2003 | Forbes |
| 6,541,079 B1 | 4/2003 | Bojarczuk, Jr. et al. |
| 6,541,280 B2 | 4/2003 | Kaushik et al. |
| 6,541,353 B1 | 4/2003 | Sandhu et al. |
| 6,544,846 B2 | 4/2003 | Ahn et al. |
| 6,544,875 B1 | 4/2003 | Wilk |
| 6,545,338 B1 | 4/2003 | Bothra et al. |
| 6,551,893 B1 | 4/2003 | Zheng et al. |
| 6,551,929 B1 | 4/2003 | Kori et al. |
| 6,552,383 B2 | 4/2003 | Ahn et al. |
| 6,555,858 B1 | 4/2003 | Jones et al. |
| 6,559,007 B1 | 5/2003 | Weimer |
| 6,559,472 B2 | 5/2003 | Sandhu et al. |
| 6,566,147 B2 | 5/2003 | Basceri et al. |
| 6,569,757 B1 | 5/2003 | Weling et al. |
| 6,570,248 B1 | 5/2003 | Ahn et al. |
| 6,573,199 B2 | 6/2003 | Sandhu et al. |
| 6,574,968 B1 | 6/2003 | Symko et al. |
| 6,586,349 B1 | 7/2003 | Jeon et al. |
| 6,586,792 B2 | 7/2003 | Ahn et al. |
| 6,586,797 B2 | 7/2003 | Forbes et al. |
| 6,590,252 B2 | 7/2003 | Kutsunai et al. |
| 6,592,661 B1 | 7/2003 | Thakur et al. |
| 6,592,942 B1 | 7/2003 | Van Wijck |
| 6,593,610 B2 | 7/2003 | Gonzalez |
| 6,596,583 B2 | 7/2003 | Agarwal et al. |
| 6,596,636 B2 | 7/2003 | Sandhu et al. |
| 6,597,037 B1 | 7/2003 | Forbes et al. |
| 6,600,339 B2 | 7/2003 | Forbes et al. |
| 6,602,053 B2 | 8/2003 | Subramanian et al. |
| 6,602,338 B2 | 8/2003 | Chen et al. |
| 6,608,378 B2 | 8/2003 | Ahn et al. |
| 6,613,656 B2 | 9/2003 | Li |
| 6,613,702 B2 | 9/2003 | Sandhu et al. |
| 6,614,092 B2 | 9/2003 | Eldridge et al. |
| 6,617,634 B2 | 9/2003 | Marsh et al. |
| 6,617,639 B1 | 9/2003 | Wang et al. |
| 6,620,670 B2 | 9/2003 | Song et al. |
| 6,627,260 B2 | 9/2003 | Derderian et al. |
| 6,627,503 B2 | 9/2003 | Ma et al. |
| 6,632,279 B1 | 10/2003 | Ritala et al. |
| 6,638,859 B2 | 10/2003 | Sneh et al. |
| 6,639,267 B2 | 10/2003 | Eldridge |
| 6,641,887 B2 | 11/2003 | Iida et al. |
| 6,642,567 B1 | 11/2003 | Marsh |
| 6,642,573 B1 | 11/2003 | Halliyal et al. |
| 6,645,882 B1 | 11/2003 | Halliyal et al. |
| 6,652,924 B2 | 11/2003 | Sherman |
| 6,653,209 B1 | 11/2003 | Yamagata |
| 6,656,371 B2 | 12/2003 | Drewes |
| 6,656,835 B2 | 12/2003 | Marsh et al. |
| 6,660,660 B2 | 12/2003 | Haukka et al. |
| 6,661,058 B2 | 12/2003 | Ahn et al. |
| 6,670,284 B2 | 12/2003 | Yin |
| 6,670,719 B2 | 12/2003 | Eldridge et al. |
| 6,673,701 B1 | 1/2004 | Marsh et al. |
| 6,674,138 B1 | 1/2004 | Halliyal et al. |
| 6,674,167 B1 | 1/2004 | Ahn et al. |
| 6,677,250 B2 | 1/2004 | Campbell et al. |
| 6,679,315 B2 | 1/2004 | Cosley et al. |
| 6,682,602 B2 | 1/2004 | Vaartstra |
| 6,683,005 B2 | 1/2004 | Sandhu et al. |
| 6,683,011 B2 | 1/2004 | Smith et al. |
| 6,686,212 B1 | 2/2004 | Conley, Jr. et al. |
| 6,686,654 B2 | 2/2004 | Farrar et al. |
| 6,689,660 B1 | 2/2004 | Noble et al. |
| 6,692,898 B2 | 2/2004 | Ning |
| 6,696,332 B2 | 2/2004 | Visokay et al. |
| 6,699,745 B1 | 3/2004 | Banerjee et al. |
| 6,699,747 B2 | 3/2004 | Ruff et al. |
| 6,700,132 B2 | 3/2004 | Chuman et al. |
| 6,709,968 B1 | 3/2004 | Eldridge et al. |
| 6,709,978 B2 | 3/2004 | Geusic et al. |
| 6,709,989 B2 | 3/2004 | Ramdani et al. |
| 6,710,538 B1 | 3/2004 | Ahn et al. |
| 6,713,329 B1 | 3/2004 | Wagner et al. |
| 6,713,846 B1 | 3/2004 | Senzaki |
| 6,720,221 B1 | 4/2004 | Ahn et al. |
| 6,723,577 B1 | 4/2004 | Geusic et al. |
| 6,727,105 B1 | 4/2004 | Brug et al. |
| 6,730,163 B2 | 5/2004 | Vaartstra |
| 6,730,367 B2 | 5/2004 | Sandhu |
| 6,730,575 B2 | 5/2004 | Eldridge |
| 6,731,531 B1 | 5/2004 | Forbes et al. |
| 6,734,510 B2 | 5/2004 | Forbes et al. |
| 6,737,309 B2 | 5/2004 | Matsuo |
| 6,737,740 B2 | 5/2004 | Forbes et al. |
| 6,737,887 B2 | 5/2004 | Forbes et al. |
| 6,744,063 B2 | 6/2004 | Yoshikawa et al. |
| 6,746,934 B2 | 6/2004 | Sandhu et al. |
| 6,747,347 B2 | 6/2004 | Farrar et al. |
| 6,750,066 B1 | 6/2004 | Cheung et al. |
| 6,750,126 B1 * | 6/2004 | Visokay et al. ............... 438/585 |
| 6,754,108 B2 | 6/2004 | Forbes |
| 6,756,237 B2 | 6/2004 | Xiao et al. |
| 6,756,292 B2 | 6/2004 | Lee et al. |
| 6,756,298 B2 | 6/2004 | Ahn et al. |
| 6,759,081 B2 | 7/2004 | Huganen et al. |
| 6,759,151 B1 | 7/2004 | Lee |
| 6,760,257 B2 | 7/2004 | Huang et al. |
| 6,762,114 B1 | 7/2004 | Chambers |
| 6,764,901 B2 | 7/2004 | Noble |

| Patent | Date | Inventor |
|---|---|---|
| 6,764,919 B2 | 7/2004 | Yu et al. |
| 6,764,941 B2 | 7/2004 | Yang et al. |
| 6,767,582 B1 | 7/2004 | Elers |
| 6,767,795 B2 | 7/2004 | Ahn et al. |
| 6,768,175 B1 | 7/2004 | Morishita et al. |
| 6,770,536 B2 | 8/2004 | Wilk et al. |
| 6,770,923 B2 | 8/2004 | Nguyen et al. |
| 6,774,050 B2 | 8/2004 | Ahn et al. |
| 6,777,353 B2 | 8/2004 | Putkonen |
| 6,777,715 B1 | 8/2004 | Geusic et al. |
| 6,778,441 B2 | 8/2004 | Forbes et al. |
| 6,780,704 B1 | 8/2004 | Raaijmakers et al. |
| 6,787,370 B2 | 9/2004 | Forbes |
| 6,787,413 B2 | 9/2004 | Ahn |
| 6,787,463 B2 | 9/2004 | Mardian et al. |
| 6,787,888 B2 | 9/2004 | Forbes et al. |
| 6,787,906 B1 | 9/2004 | Yang et al. |
| 6,787,992 B2 | 9/2004 | Chuman et al. |
| 6,790,791 B2 | 9/2004 | Ahn et al. |
| 6,794,255 B1 | 9/2004 | Forbes et al. |
| 6,794,315 B1 | 9/2004 | Klemperer et al. |
| 6,794,709 B2 | 9/2004 | Ahn et al. |
| 6,794,735 B2 | 9/2004 | Forbes et al. |
| 6,800,567 B2 | 10/2004 | Cho |
| 6,803,311 B2 | 10/2004 | Choi |
| 6,803,326 B2 | 10/2004 | Ahn et al. |
| 6,804,136 B2 | 10/2004 | Forbes |
| 6,808,978 B2 | 10/2004 | Kim |
| 6,812,100 B2 | 11/2004 | Ahn et al. |
| 6,812,137 B2 | 11/2004 | Forbes et al. |
| 6,812,513 B2 | 11/2004 | Geusic et al. |
| 6,812,516 B2 | 11/2004 | Noble et al. |
| 6,815,804 B2 | 11/2004 | Forbes |
| 6,818,937 B2 | 11/2004 | Noble et al. |
| 6,821,862 B2 | 11/2004 | Cho |
| 6,821,873 B2 | 11/2004 | Visokay et al. |
| 6,828,632 B2 | 12/2004 | Bhattacharyya |
| 6,828,656 B2 | 12/2004 | Forbes et al. |
| 6,831,315 B2 | 12/2004 | Raaijmakers et al. |
| 6,833,285 B1 | 12/2004 | Ahn et al. |
| 6,833,308 B2 | 12/2004 | Ahn et al. |
| 6,833,317 B2 | 12/2004 | Forbes et al. |
| 6,835,111 B2 | 12/2004 | Ahn et al. |
| 6,838,404 B2 | 1/2005 | Hentges et al. |
| 6,844,203 B2 | 1/2005 | Ahn et al. |
| 6,844,256 B2 | 1/2005 | Forbes et al. |
| 6,844,260 B2 | 1/2005 | Sarigiannis et al. |
| 6,846,574 B2 | 1/2005 | Subramanian |
| 6,846,738 B2 | 1/2005 | Forbes et al. |
| 6,852,167 B2 | 2/2005 | Ahn |
| 6,852,613 B2 | 2/2005 | Forbes et al. |
| 6,852,645 B2 | 2/2005 | Colombo et al. |
| 6,858,120 B2 | 2/2005 | Ahn et al. |
| 6,858,444 B2 | 2/2005 | Ahn et al. |
| 6,858,865 B2 | 2/2005 | Ahn et al. |
| 6,884,706 B2 | 4/2005 | Forbes et al. |
| 6,884,719 B2 | 4/2005 | Chang et al. |
| 6,884,739 B2 | 4/2005 | Ahn et al. |
| 6,887,758 B2 | 5/2005 | Chindalore et al. |
| 6,888,739 B2 | 5/2005 | Forbes |
| 6,890,843 B2 | 5/2005 | Forbes et al. |
| 6,893,984 B2 | 5/2005 | Ahn et al. |
| 6,900,116 B2 | 5/2005 | Forbes et al. |
| 6,900,122 B2 | 5/2005 | Ahn et al. |
| 6,900,481 B2 | 5/2005 | Jin et al. |
| 6,903,003 B2 | 6/2005 | Forbes et al. |
| 6,903,444 B2 | 6/2005 | Forbes et al. |
| 6,906,402 B2 | 6/2005 | Forbes et al. |
| 6,914,278 B2 | 7/2005 | Forbes et al. |
| 6,914,800 B2 | 7/2005 | Ahn et al. |
| 6,916,668 B2 | 7/2005 | Spielberger et al. |
| 6,919,266 B2 | 7/2005 | Ahn et al. |
| 6,921,702 B2 | 7/2005 | Ahn et al. |
| 6,930,059 B2 | 8/2005 | Conley, Jr. et al. |
| 6,930,346 B2 | 8/2005 | Ahn et al. |
| 6,933,225 B2 | 8/2005 | Werkhoven et al. |
| 6,952,032 B2 | 10/2005 | Forbes et al. |
| 6,953,730 B2 | 10/2005 | Ahn et al. |
| 6,955,968 B2 | 10/2005 | Forbes et al. |
| 6,958,302 B2 | 10/2005 | Ahn et al. |
| 6,958,937 B2 | 10/2005 | Forbes et al. |
| 6,960,538 B2 | 11/2005 | Ahn et al. |
| 6,963,103 B2 | 11/2005 | Forbes |
| 6,979,855 B2 | 12/2005 | Ahn et al. |
| 6,982,230 B2 | 1/2006 | Cabral et al. |
| 6,989,573 B2 | 1/2006 | Ahn et al. |
| 7,012,297 B2 | 3/2006 | Bhattacharyya |
| 7,012,311 B2 | 3/2006 | Ohmi et al. |
| 7,026,694 B2 | 4/2006 | Ahn et al. |
| 7,037,574 B2 | 5/2006 | Paranjpe et al. |
| 7,042,043 B2 | 5/2006 | Forbes et al. |
| 7,045,430 B2 | 5/2006 | Ahn et al. |
| 7,049,192 B2 | 5/2006 | Ahn et al. |
| 7,064,058 B2 | 6/2006 | Ahn et al. |
| 7,067,439 B2 | 6/2006 | Metzner et al. |
| 7,074,673 B2 | 7/2006 | Forbes |
| 7,081,421 B2 | 7/2006 | Ahn et al. |
| 7,084,078 B2 | 8/2006 | Ahn et al. |
| 7,087,954 B2 | 8/2006 | Forbes |
| 7,101,813 B2 | 9/2006 | Ahn et al. |
| 7,112,841 B2 | 9/2006 | Eldridge et al. |
| 7,122,415 B2 | 10/2006 | Jang et al. |
| 7,129,553 B2 | 10/2006 | Ahn et al. |
| 7,135,369 B2 | 11/2006 | Ahn et al. |
| 7,135,421 B2 | 11/2006 | Ahn et al. |
| 7,135,734 B2 | 11/2006 | Eldridge et al. |
| 7,138,336 B2 | 11/2006 | Lee et al. |
| 7,160,577 B2 | 1/2007 | Ahn et al. |
| 7,166,886 B2 | 1/2007 | Forbes |
| 7,169,673 B2 | 1/2007 | Ahn et al. |
| 7,183,186 B2 | 2/2007 | Ahn et al. |
| 7,187,587 B2 | 3/2007 | Forbes |
| 7,192,824 B2 | 3/2007 | Ahn et al. |
| 7,192,892 B2 | 3/2007 | Ahn et al. |
| 7,199,023 B2 | 4/2007 | Ahn et al. |
| 7,205,218 B2 | 4/2007 | Ahn et al. |
| 7,205,620 B2 | 4/2007 | Ahn et al. |
| 7,208,804 B2 | 4/2007 | Ahn et al. |
| 7,221,017 B2 | 5/2007 | Forbes et al. |
| 7,221,586 B2 | 5/2007 | Forbes et al. |
| 7,235,501 B2 | 6/2007 | Ahn et al. |
| 7,235,854 B2 | 6/2007 | Ahn et al. |
| 7,259,434 B2 | 8/2007 | Ahn et al. |
| 7,274,067 B2 | 9/2007 | Forbes |
| 7,326,980 B2 | 2/2008 | Ahn et al. |
| 2001/0002280 A1 | 5/2001 | Sneh |
| 2001/0005625 A1 | 6/2001 | Sun |
| 2001/0009695 A1 | 7/2001 | Saanila et al. |
| 2001/0012698 A1 | 8/2001 | Hayashi et al. |
| 2001/0014526 A1 | 8/2001 | Clevenger et al. |
| 2001/0017369 A1 | 8/2001 | Iwasaki et al. |
| 2001/0019876 A1 | 9/2001 | Juengling et al. |
| 2001/0024387 A1 | 9/2001 | Raaijmakers et al. |
| 2001/0030352 A1 | 10/2001 | Ruf et al. |
| 2001/0034117 A1 | 10/2001 | Eldridge et al. |
| 2001/0040430 A1 | 11/2001 | Ito et al. |
| 2001/0042505 A1 | 11/2001 | Vaartstra |
| 2001/0050438 A1 | 12/2001 | Juengling et al. |
| 2001/0051442 A1 | 12/2001 | Katsir et al. |
| 2001/0053082 A1 | 12/2001 | Chipalkatti et al. |
| 2001/0053096 A1 | 12/2001 | Forbes et al. |
| 2001/0053577 A1 | 12/2001 | Forbes et al. |
| 2002/0001219 A1 | 1/2002 | Forbes et al. |
| 2002/0001971 A1 | 1/2002 | Cho |
| 2002/0002216 A1 | 1/2002 | Tooley |
| 2002/0004276 A1 | 1/2002 | Ahn et al. |

| | | | | | |
|---|---|---|---|---|---|
| 2002/0004277 A1 | 1/2002 | Ahn et al. | 2003/0045078 A1 | 3/2003 | Ahn et al. |
| 2002/0013052 A1 | 1/2002 | Visokay | 2003/0045082 A1 | 3/2003 | Eldridge et al. |
| 2002/0019125 A1 | 2/2002 | Juengling et al. | 2003/0048666 A1 | 3/2003 | Eldridge et al. |
| 2002/0022156 A1 | 2/2002 | Bright | 2003/0048745 A1 | 3/2003 | Yoshikawa et al. |
| 2002/0024080 A1 | 2/2002 | Derderian et al. | 2003/0049900 A1 | 3/2003 | Fornes et al. |
| 2002/0025628 A1 | 2/2002 | Derderian et al. | 2003/0049942 A1 | 3/2003 | Haukka et al. |
| 2002/0037603 A1 | 3/2002 | Eldridge et al. | 2003/0052356 A1 | 3/2003 | Yang et al. |
| 2002/0037615 A1 | 3/2002 | Matsuo | 2003/0052358 A1 | 3/2003 | Weimer |
| 2002/0046705 A1 | 4/2002 | Sandhu et al. | 2003/0059535 A1 | 3/2003 | Luo et al. |
| 2002/0051859 A1 | 5/2002 | Iida et al. | 2003/0062261 A1 | 4/2003 | Shindo |
| 2002/0053869 A1 | 5/2002 | Ahn et al. | 2003/0064607 A1 | 4/2003 | Leu et al. |
| 2002/0058578 A1 | 5/2002 | Shindo | 2003/0067046 A1 | 4/2003 | Iwasaki et al. |
| 2002/0068466 A1 | 6/2002 | Lee et al. | 2003/0102501 A1 | 6/2003 | Yang et al. |
| 2002/0072164 A1 | 6/2002 | Umotoy et al. | 2003/0104666 A1 | 6/2003 | Bojarczuk, Jr. et al. |
| 2002/0076070 A1 | 6/2002 | Yoshikawa et al. | 2003/0116804 A1 | 6/2003 | Visokay et al. |
| 2002/0086507 A1 | 7/2002 | Park et al. | 2003/0119246 A1 | 6/2003 | Ahn |
| 2002/0086555 A1 | 7/2002 | Ahn et al. | 2003/0119291 A1 | 6/2003 | Ahn et al. |
| 2002/0089023 A1 | 7/2002 | Yu et al. | 2003/0119313 A1 | 6/2003 | Yang et al. |
| 2002/0089063 A1 | 7/2002 | Ahn et al. | 2003/0124794 A1 | 7/2003 | Girardie |
| 2002/0090806 A1 | 7/2002 | Ahn et al. | 2003/0130127 A1 | 7/2003 | Hentges et al. |
| 2002/0094632 A1 | 7/2002 | Agarwal et al. | 2003/0132491 A1 | 7/2003 | Ahn |
| 2002/0100418 A1 | 8/2002 | Sandhu et al. | 2003/0136995 A1 | 7/2003 | Geusic et al. |
| 2002/0102818 A1 | 8/2002 | Gurtej et al. | 2003/0139039 A1 | 7/2003 | Ahn et al. |
| 2002/0105087 A1 | 8/2002 | Forbes et al. | 2003/0142569 A1 | 7/2003 | Forbes |
| 2002/0110991 A1 | 8/2002 | Li | 2003/0143801 A1 | 7/2003 | Basceri et al. |
| 2002/0111001 A1 | 8/2002 | Ahn | 2003/0148627 A1 | 8/2003 | Aoki et al. |
| 2002/0113261 A1 | 8/2002 | Iwasaki et al. | 2003/0157764 A1 | 8/2003 | Ahn et al. |
| 2002/0117704 A1 | 8/2002 | Gonzalez | 2003/0159653 A1 | 8/2003 | Dando et al. |
| 2002/0117963 A1 | 8/2002 | Chuman et al. | 2003/0162399 A1 | 8/2003 | Singh et al. |
| 2002/0119297 A1 | 8/2002 | Forrest et al. | 2003/0170389 A1 | 9/2003 | Sandhu |
| 2002/0122885 A1 | 9/2002 | Ahn | 2003/0170403 A1 | 9/2003 | Doan et al. |
| 2002/0125490 A1 | 9/2002 | Chuman et al. | 2003/0173652 A1 | 9/2003 | Forbes et al. |
| 2002/0130338 A1 | 9/2002 | Ahn et al. | 2003/0173653 A1 | 9/2003 | Forbes et al. |
| 2002/0130378 A1 | 9/2002 | Forbes et al. | 2003/0174529 A1 | 9/2003 | Forbes et al. |
| 2002/0135048 A1 | 9/2002 | Ahn et al. | 2003/0175411 A1 | 9/2003 | Kodas et al. |
| 2002/0142536 A1 | 10/2002 | Zhang et al. | 2003/0176023 A1 | 9/2003 | Forbes et al. |
| 2002/0142569 A1 | 10/2002 | Chang et al. | 2003/0176025 A1 | 9/2003 | Forbes et al. |
| 2002/0145901 A1 | 10/2002 | Auerbach et al. | 2003/0176049 A1 | 9/2003 | Hegde et al. |
| 2002/0146916 A1 | 10/2002 | Irino et al. | 2003/0176050 A1 | 9/2003 | Forbes et al. |
| 2002/0155688 A1 | 10/2002 | Ahn | 2003/0176052 A1 | 9/2003 | Forbes et al. |
| 2002/0155689 A1 | 10/2002 | Ahn | 2003/0176053 A1 | 9/2003 | Forbes et al. |
| 2002/0164420 A1 | 11/2002 | Derderian et al. | 2003/0181039 A1 | 9/2003 | Sandhu et al. |
| 2002/0167057 A1 | 11/2002 | Ahn et al. | 2003/0181060 A1 | 9/2003 | Asai et al. |
| 2002/0167089 A1 | 11/2002 | Ahn et al. | 2003/0183156 A1 | 10/2003 | Dando et al. |
| 2002/0170671 A1 | 11/2002 | Matsuhita et al. | 2003/0193061 A1 | 10/2003 | Osten |
| 2002/0172768 A1 | 11/2002 | Endo et al. | 2003/0194861 A1 | 10/2003 | Mardian et al. |
| 2002/0172799 A1 | 11/2002 | Subramanian | 2003/0194862 A1 | 10/2003 | Mardian |
| 2002/0175423 A1 | 11/2002 | Forbes et al. | 2003/0203626 A1 | 10/2003 | Derderian et al. |
| 2002/0177244 A1 | 11/2002 | Hsu et al. | 2003/0205774 A1 | 11/2003 | Hokazono |
| 2002/0177282 A1 | 11/2002 | Song | 2003/0207032 A1 | 11/2003 | Ahn et al. |
| 2002/0190294 A1 | 12/2002 | Iizuka et al. | 2003/0207540 A1 | 11/2003 | Ahn et al. |
| 2002/0192974 A1 | 12/2002 | Ahn et al. | 2003/0207564 A1 | 11/2003 | Ahn et al. |
| 2002/0192975 A1 | 12/2002 | Ahn | 2003/0207566 A1 | 11/2003 | Forbes et al. |
| 2002/0192979 A1 | 12/2002 | Ahn | 2003/0207593 A1 | 11/2003 | Derderian et al. |
| 2002/0195056 A1 | 12/2002 | Sandhu et al. | 2003/0216038 A1 | 11/2003 | Madhukar et al. |
| 2002/0197793 A1 | 12/2002 | Dornfest et al. | 2003/0224600 A1 | 12/2003 | Cao et al. |
| 2003/0001190 A1 | 1/2003 | Basceri et al. | 2003/0227033 A1 | 12/2003 | Ahn et al. |
| 2003/0001212 A1 | 1/2003 | Hu et al. | 2003/0228747 A1 | 12/2003 | Ahn et al. |
| 2003/0001241 A1 | 1/2003 | Chakrabarti et al. | 2003/0232501 A1 | 12/2003 | Kher et al. |
| 2003/0003635 A1 | 1/2003 | Paranjpe et al. | 2003/0232511 A1 | 12/2003 | Metzner et al. |
| 2003/0003702 A1 | 1/2003 | Ahn | 2003/0235961 A1 | 12/2003 | Metzner et al. |
| 2003/0003722 A1 | 1/2003 | Vaartstra | 2004/0004244 A1 | 1/2004 | Ahn et al. |
| 2003/0003730 A1 | 1/2003 | Li | 2004/0004245 A1 | 1/2004 | Forbes et al. |
| 2003/0008243 A1 | 1/2003 | Ahn et al. | 2004/0004247 A1 | 1/2004 | Forbes et al. |
| 2003/0017717 A1 | 1/2003 | Ahn | 2004/0004859 A1 | 1/2004 | Forbes et al. |
| 2003/0020169 A1 | 1/2003 | Ahn et al. | 2004/0007171 A1 | 1/2004 | Ritala et al. |
| 2003/0020180 A1 | 1/2003 | Ahn et al. | 2004/0009679 A1 | 1/2004 | Yeo et al. |
| 2003/0026697 A1 | 2/2003 | Subramanian et al. | 2004/0016944 A1 | 1/2004 | Ahn et al. |
| 2003/0027360 A1 | 2/2003 | Hsu et al. | 2004/0023461 A1 | 2/2004 | Ahn et al. |
| 2003/0032270 A1 | 2/2003 | Snyder et al. | 2004/0033661 A1 | 2/2004 | Yeo et al. |
| 2003/0042526 A1 | 3/2003 | Weimer | 2004/0033681 A1 | 2/2004 | Ahn et al. |
| 2003/0043637 A1 | 3/2003 | Forbes et al. | 2004/0033701 A1 | 2/2004 | Ahn et al. |
| 2003/0045060 A1 | 3/2003 | Ahn | 2004/0036129 A1 | 2/2004 | Forbes et al. |

| | | |
|---|---|---|
| 2004/0038525 A1 | 2/2004 | Meng et al. |
| 2004/0038554 A1 | 2/2004 | Ahn |
| 2004/0043541 A1 | 3/2004 | Ahn |
| 2004/0043569 A1 | 3/2004 | Ahn |
| 2004/0043635 A1 | 3/2004 | Vaartstra |
| 2004/0065255 A1 | 4/2004 | Yang et al. |
| 2004/0087124 A1 | 5/2004 | Kubota et al. |
| 2004/0099889 A1 | 5/2004 | Frank et al. |
| 2004/0108587 A1 | 6/2004 | Chudzik et al. |
| 2004/0110348 A1 | 6/2004 | Ahn et al. |
| 2004/0110391 A1 | 6/2004 | Ahn et al. |
| 2004/0140513 A1 | 7/2004 | Forbes et al. |
| 2004/0144980 A1 | 7/2004 | Ahn et al. |
| 2004/0161899 A1 | 8/2004 | Luo et al. |
| 2004/0164357 A1 | 8/2004 | Ahn et al. |
| 2004/0164365 A1 | 8/2004 | Ahn et al. |
| 2004/0168627 A1 | 9/2004 | Conley, Jr. et al. |
| 2004/0169453 A1 | 9/2004 | Ahn et al. |
| 2004/0171280 A1 | 9/2004 | Conley, Jr. et al. |
| 2004/0175882 A1 | 9/2004 | Ahn et al. |
| 2004/0178439 A1 | 9/2004 | Ahn et al. |
| 2004/0183108 A1 | 9/2004 | Ahn |
| 2004/0185630 A1 | 9/2004 | Forbes et al. |
| 2004/0185654 A1 | 9/2004 | Ahn |
| 2004/0189175 A1 | 9/2004 | Ahn et al. |
| 2004/0203254 A1 | 10/2004 | Conley, Jr. et al. |
| 2004/0214399 A1 | 10/2004 | Ahn et al. |
| 2004/0219783 A1 | 11/2004 | Ahn et al. |
| 2004/0222476 A1 | 11/2004 | Ahn et al. |
| 2004/0235313 A1 | 11/2004 | Frank et al. |
| 2004/0248398 A1 | 12/2004 | Ahn et al. |
| 2004/0262700 A1 | 12/2004 | Ahn et al. |
| 2004/0266217 A1 | 12/2004 | Kim et al. |
| 2005/0006727 A1 | 1/2005 | Forbes et al. |
| 2005/0007817 A1 | 1/2005 | Forbes et al. |
| 2005/0009370 A1 | 1/2005 | Ahn |
| 2005/0017327 A1 | 1/2005 | Forbes et al. |
| 2005/0020017 A1 | 1/2005 | Ahn et al. |
| 2005/0023574 A1 | 2/2005 | Forbes et al. |
| 2005/0023584 A1 | 2/2005 | Derderian et al. |
| 2005/0023594 A1 | 2/2005 | Ahn et al. |
| 2005/0023595 A1 | 2/2005 | Forbes et al. |
| 2005/0023602 A1 | 2/2005 | Forbes et al. |
| 2005/0023624 A1 | 2/2005 | Ahn et al. |
| 2005/0023625 A1 | 2/2005 | Ahn et al. |
| 2005/0023626 A1 | 2/2005 | Ahn et al. |
| 2005/0023627 A1 | 2/2005 | Ahn et al. |
| 2005/0023650 A1 | 2/2005 | Forbes et al. |
| 2005/0024092 A1 | 2/2005 | Forbes |
| 2005/0026349 A1 | 2/2005 | Forbes et al. |
| 2005/0026374 A1 | 2/2005 | Ahn et al. |
| 2005/0026458 A1 | 2/2005 | Basceri et al. |
| 2005/0029545 A1 | 2/2005 | Forbes et al. |
| 2005/0029547 A1 | 2/2005 | Ahn et al. |
| 2005/0029604 A1 | 2/2005 | Ahn et al. |
| 2005/0029605 A1 | 2/2005 | Ahn et al. |
| 2005/0030803 A1 | 2/2005 | Forbes et al. |
| 2005/0030825 A1 | 2/2005 | Ahn |
| 2005/0032292 A1 | 2/2005 | Ahn et al. |
| 2005/0032342 A1 | 2/2005 | Forbes et al. |
| 2005/0034662 A1 | 2/2005 | Ahn |
| 2005/0037563 A1 | 2/2005 | Ahn |
| 2005/0054165 A1 | 3/2005 | Ahn et al. |
| 2005/0077519 A1 | 4/2005 | Ahn et al. |
| 2005/0087134 A1 | 4/2005 | Ahn |
| 2005/0124174 A1 | 6/2005 | Ahn et al. |
| 2005/0124175 A1 | 6/2005 | Ahn et al. |
| 2005/0138262 A1 | 6/2005 | Forbes |
| 2005/0145957 A1 | 7/2005 | Ahn et al. |
| 2005/0145959 A1 | 7/2005 | Forbes |
| 2005/0158973 A1 | 7/2005 | Ahn et al. |
| 2005/0164521 A1 | 7/2005 | Ahn et al. |
| 2005/0169054 A1 | 8/2005 | Forbes |
| 2005/0227442 A1 | 10/2005 | Ahn et al. |
| 2005/0277256 A1 | 12/2005 | Ahn et al. |
| 2005/0280067 A1 | 12/2005 | Ahn et al. |
| 2005/0285225 A1 | 12/2005 | Ahn et al. |
| 2006/0000412 A1 | 1/2006 | Ahn et al. |
| 2006/0003517 A1 | 1/2006 | Ahn et al. |
| 2006/0008966 A1 | 1/2006 | Forbes et al. |
| 2006/0023513 A1 | 2/2006 | Forbes et al. |
| 2006/0024975 A1 | 2/2006 | Ahn et al. |
| 2006/0028867 A1 | 2/2006 | Forbes et al. |
| 2006/0028869 A1 | 2/2006 | Forbes et al. |
| 2006/0043492 A1 | 3/2006 | Ahn et al. |
| 2006/0043504 A1 | 3/2006 | Ahn et al. |
| 2006/0046505 A1 | 3/2006 | Ahn et al. |
| 2006/0046522 A1 | 3/2006 | Ahn et al. |
| 2006/0125030 A1 | 6/2006 | Ahn et al. |
| 2006/0128168 A1 | 6/2006 | Ahn et al. |
| 2006/0148180 A1 | 7/2006 | Ahn et al. |
| 2006/0176645 A1 | 8/2006 | Ahn et al. |
| 2006/0177975 A1 | 8/2006 | Ahn et al. |
| 2006/0183272 A1 | 8/2006 | Ahn et al. |
| 2006/0189154 A1 | 8/2006 | Ahn et al. |
| 2006/0223337 A1 | 10/2006 | Ahn et al. |
| 2006/0228868 A1 | 10/2006 | Ahn et al. |
| 2006/0237764 A1 | 10/2006 | Ahn et al. |
| 2006/0244082 A1 | 11/2006 | Ahn et al. |
| 2006/0244100 A1 | 11/2006 | Ahn et al. |
| 2006/0245984 A1 | 11/2006 | Kulkarni et al. |
| 2006/0246741 A1 | 11/2006 | Ahn et al. |
| 2006/0252211 A1 | 11/2006 | Ahn et al. |
| 2006/0255470 A1 | 11/2006 | Ahn et al. |
| 2006/0258097 A1 | 11/2006 | Forbes et al. |
| 2006/0261376 A1 | 11/2006 | Forbes et al. |
| 2006/0261397 A1 | 11/2006 | Ahn et al. |
| 2006/0263972 A1 | 11/2006 | Ahn et al. |
| 2006/0263981 A1 | 11/2006 | Forbes |
| 2006/0264064 A1 | 11/2006 | Ahn et al. |
| 2006/0270147 A1 | 11/2006 | Ahn et al. |
| 2006/0274580 A1 | 12/2006 | Forbes |
| 2006/0281330 A1 | 12/2006 | Ahn et al. |
| 2007/0007560 A1 | 1/2007 | Forbes et al. |
| 2007/0007635 A1 | 1/2007 | Forbes et al. |
| 2007/0010060 A1 | 1/2007 | Forbes et al. |
| 2007/0010061 A1 | 1/2007 | Forbes et al. |
| 2007/0018214 A1 | 1/2007 | Ahn |
| 2007/0020835 A1 | 1/2007 | Ahn et al. |
| 2007/0037415 A1 | 2/2007 | Ahn et al. |
| 2007/0045752 A1 | 3/2007 | Forbes et al. |
| 2007/0048926 A1 | 3/2007 | Ahn |
| 2007/0049051 A1 | 3/2007 | Ahn et al. |
| 2007/0049054 A1 | 3/2007 | Ahn et al. |
| 2007/0059881 A1 | 3/2007 | Ahn et al. |
| 2007/0087563 A1 | 4/2007 | Ahn et al. |
| 2007/0090439 A1 | 4/2007 | Ahn et al. |
| 2007/0090440 A1 | 4/2007 | Ahn et al. |
| 2007/0090441 A1 | 4/2007 | Ahn et al. |
| 2007/0092989 A1 | 4/2007 | Kraus et al. |
| 2007/0099366 A1 | 5/2007 | Ahn et al. |
| 2007/0101929 A1 | 5/2007 | Ahn et al. |
| 2007/0105313 A1 | 5/2007 | Forbes |
| 2007/0107661 A1 | 5/2007 | Ahn |
| 2007/0111544 A1 | 5/2007 | Ahn |
| 2007/0131169 A1 | 6/2007 | Ahn |
| 2007/0134931 A1 | 6/2007 | Ahn et al. |
| 2007/0134942 A1 | 6/2007 | Ahn et al. |
| 2007/0158765 A1 | 7/2007 | Ahn et al. |
| 2007/0178643 A1 | 8/2007 | Forbes et al. |
| 2007/0181931 A1 | 8/2007 | Ahn et al. |
| 2007/0187772 A1 | 8/2007 | Ahn et al. |

FOREIGN PATENT DOCUMENTS

| | | |
|---|---|---|
| EP | 0540993 A1 | 5/1993 |

| | | |
|---|---|---|
| EP | 1096042 | 5/2001 |
| EP | 1122795 A2 | 8/2001 |
| EP | 1124262 | 8/2001 |
| EP | 1324376 A1 | 7/2003 |
| GB | 2158995 A | 11/1985 |
| WO | WO-01/97257 | 12/2001 |
| WO | WO-02/31875 | 4/2002 |
| WO | WO-02/43115 | 5/2002 |
| WO | WO-04079796 A3 | 9/2004 |

OTHER PUBLICATIONS

Aarik, Jaan, et al., "Influence of substrate temperature on atomic layer growth and properties of HfO/sub 2/thin films", *Thin Solid Films*, 340(1-2), (1999), 110-116.

Aarik, Jaan, et al., "Phase transformations in hafnium dioxide thin films grown by atomic layer deposition at high temperatures", *Applied Surface Science*, 173(1-2), (Mar. 2001), 15-21.

Aarik, Jaan, et al., "Texture development in nanocrystalline hafnium dioxide thin films grown by atomic layer deposition", *Journal of Crystal Growth*, 220(1-2), (Nov. 15, 2000), 105-113.

Ahn, Kie Y., et al., "ALD of Amorphous Lanthanide Doped TIOX Films", U.S. Appl. No. 11/092,072, filed Mar. 29, 2005.

Ahn, Kie Y., et al., "Atomic Layer Deposited Hafnium Tantalum Oxide Dielectrics", U.S. Appl. No. 11/029,757, filed Jan. 5, 2005.

Ahn, Kie Y., et al., "Atomic Layer Deposited Lanthanum Aluminum Oxide Dielectric Layer", U.S. Appl. No. 10/930,167, filed Aug. 31, 2004.

Ahn, Kie Y., et al., "Atomic Layer Deposited Lanthanum Hafnium Oxide Dielectrics", U.S. Appl. No. 11/010,529, filed Dec. 13, 2004.

Ahn, Kie Y., et al., "Atomic Layer Deposited Titanium Aluminum Oxide Films", U.S. Appl. No. 10/931,533, filed Aug. 31, 2004.

Ahn, Kie Y., et al., "Atomic Layer Deposition of Hf3N4/HfO2 Films as Gate Dielectrics", U.S. Appl. No. 11/063,717, filed Feb. 23, 2005.

Ahn, Kie Y., et al., "Atomic Layer Deposition of Zirconium-Doped Tantalum Oxide Films", U.S. Appl. No. 10/909,959, filed Aug. 2, 2004.

Ahn, Kie Y., et al., "Atomic Layer Deposition of Zr3N4/ZrO2 Films as Gate Dielectrics", U.S. Appl. No. 11/058,563, filed Feb. 15, 2005.

Ahn, Kie Y., et al., "Hybrid ALD-CVD of PrXOY/ZrO2 Films as Gate Dielectrics", U.S. Appl. No. 11/010,766, filed Dec. 13, 2004.

Ahn, Kie Y., et al., "Ruthenium Gate for a Lanthanide Oxide Dielectric Layer", U.S. Appl. No. 10/926,812, filed Aug. 26, 2004.

Bendoraitis, J G., et al., "Optical energy gaps in the monoclinic oxides of hafnium and zirconium and their solid solutions", *Journal of Physical Chemistry*, 69(10), (1965),3666-3667.

Callegari, A., et al., "Physical and electrical characterization of Hafnium oxide and Hafnium silicate sputtered films", *Journal of Applied Physics*, 90(12), (Dec. 15, 2001),6466-75.

Cheng, Baohong, et al., "The Impact of High-k Gate Dielectrics and Metal Gate Electrodes on Sub-100nm MOSFET's", *IEEE Transactions on Electron Devices*, 46(7), (Jul. 1999), 1537-1544.

Clark, P, "IMEC Highlights Hafnium, Metal Gates for High-k Integration", *Semiconductor Business News*, at Silicon Strategies.com,(Oct. 11, 2002),2 pages.

Colombo, D., et al., "Anhydrous Metal Nitrates as Volatile Single Source Precursors for the CVD of Metal Oxide Films", *Communications, Department of EE, U of M*, Mpls, MN, (Jul. 7, 1998),3 pages.

Conley, Jr., J. F., et al., "Atomic Layer Deposition of Hafnium Oxide Using Anhydrous Hafnium Nitrate", *Electrochemical and Solid-State Letters*, 5(5), (2002),C57-C59.

Forsgren, Katarina, "Atomic Layer Deposition of HfO2 using hafnium iodide", Conference held in Monterey, California, (May 2001), 1 page.

Forsgren, Katarina, "CVD and ALD of Group IV- and V-Oxides for Dielectric Applications", *Comprehensive Summaries of Uppsala Dissertation from the Faculty of Science and Technology*, 665, (2001).

Gusev, E P., "Ultrathin High-K Dielectrics Grown by Atomic Layer Deposition: A Comparative Study of ZrO2, HfO2, Y2O3, and Al2O3", *Electrochemical Society Proceedings* vol. 2001-9, (2001),189-195.

Gutowski, M J., "Thermodynamic stability of high-K dielectric metal oxides ZrO/sub 2/ and HfO/sub 2/ in contact with Si and SiO/sub 2/", *Applied Physics Letters*, 80(11), (Mar. 18, 2002), 1897-1899.

Hoshino, Y., et al., "Characterization and Control of the HfO2/Si(001) Interfaces", *Applied Physics Letters*, 81, (Sep. 30, 2002),2650-2652.

Hubbard, K. J., et al., "Thermodynamic stability of binary oxides in contact with silicon", *Journal of Materials Research*, 11(11), (Nov. 1996),2757-2776.

Jung, H S., et al., "Improved current performance of CMOSFETs with nitrogen incorporated HfO/sub 2/-Al/sub 2/O/sub 3/ laminate gate dielectric", *Technical Digest of International Electron Devices Meeting 2002*, 853-856.

Kang, L, et al., "MOSFET devices with polysilicon on single-layer HfO/sub 2/ high-K dielectrics", *International Electron Devices Meeting 2000. Technical Digest. IEDM*, (2000),35-8.

Kukli, Kaupo, et al., "Comparison of hafnium oxide films grown by atomic layer deposition from iodide and chloride precursors", *Thin Solid Films*, 416, (2002),72-79.

Kukli, K J., et al., "Properties of hafnium oxide films grown by atomic layer deposition from hafnium tetraiodide and oxygen", *Journal of Applied Physics*, 92(10), (Nov. 15, 2002),5698-5703.

Lee, S. J., et al., "Hafnium oxide gate stack prepared by in situ rapid thermal chemical vapor deposition process for advanced gate dielectrics", *Journal of Applied Physics*, 92 (5), (Sep. 1, 2002),2807-09.

Lee, Jung-Hyoung, et al., "Mass production worthy HfO/sub 2/-Al/sub 2/O/sub 3/ laminate capacitor technology using Hf liquid precursor for sub-100 nm DRAMs", *Electron Devices Meeting, 2002. IEDM '02. Digest. International*, (2002),221-224.

Lee, Byoung H., et al., "Ultrathin Hafnium Oxide with Low Leakage and excellent Reliability for Alternative Gate Dielectric Application", *IEEE Technical Digest of International Electron Devices Meeting 1999*,133-136.

Leskela, M., et al., "ALD precursor chemistry: Evolution and future challenges", *J. Phys. IV France*, 9, (1999),837-852.

Neumayer, D A., et al., "Materials characterization of ZrO/sub 2/-SiO/sub 2/ and HfO/sub 2/-SiO/sub 2/ binary oxides deposited by chemical solution deposition", *Journal of Applied Physics*, 90(4), (Aug. 15, 2001), 1801-1808.

Park, Jaehoo, et al., "Chemical vapor deposition of HfO/sub 2/ thin films using a novel carbon-free precursor: characterization of the interface with the silicon substrate", *Journal of the Electrochemical Society*, 149(1), (2002),G89-G94.

Park, Byoung K., et al., "Interfacial reaction between chemically vapor-deposited HfO2 thin films and a HF-cleaned Si substrate during film growth and postannealing", *Applied Physics Letters*, 80(13), (Apr. 1, 2002),2368-70.

Poveshchenko, V P., et al., "Investigation of the phase composition of films of zirconium, hafnium and yttrium oxides", *Soviet Journal of Optical Technology*, 51(5), (1984),277-279.

Rayner Jr., G, et al., "The structure of plasma-deposited and annealed pseudo-binary ZrO2-SiO2 alloys", *Materials Research Society Symposium-Proceedings*, 611, (2000),C131-C139.

Smith, Ryan C., et al., "Chemical Vapour Deposition of the Oxides of Titanium, Zirconium and Hafnium for Use as High-k Materials in Microelectronic Devices. A Carbon-free Precursor for the Synthesis of Hafnium Dioxide", *Advanced Materials for Optics and Electronics*, 10(3-5), (2000),105-114.

Sneh, Ofer, "Thin film atomic layer deposition equipment for semiconductor processing", *Thin Solid Films*, 402(1-2), (Jan. 2002),248-261.

Stathis, J. H., et al., "Reliability Projection for Ultra-Thin Oxides at Low Voltage", *Tech. Dig. International Electron Device Meeting*, (1998), 167-9.

Suntola, T, "Atomic layer epitaxy", *Thin Solid Films*, 216(1), (Aug. 28, 1992),84-89.

Suntola, T., "Atomic Layer Epitaxy", *Handbook of Crystal Growth, 3; Thin Films of Epitaxy, Part B: Growth Mechanics and Dynamics*, Amsterdam,(1994),601-663.

Tavel, B, et al., "High performance 40 nm nMOSFETs with HfO/sub 2/ gate dielectric and polysilicon damascene gate", *Technical Digest of International Electron Devices Meetings 2000*, 429-432.

Wilk, G. D., et al., "High-K gate dielectrics: Current status and materials properties considerations", *Journal of Applied Physics*, 89(10), (May 2001),5243-5275.

Wolf, S., et al., *Silicon Processing for the VLSI Era—vol. 4: Deep-Submicron Process Technology*, Lattice Press, Sunset Beach, CA,(2002),p. 98, 146 173-174.

Yamamoto, K., et al., "Effect of Hf metal predeposition on the properties of sputtered HfO2/Hf stacked gate dielectrics", *Applied Physics Letters*, 81, (Sep. 9, 2002),2053-2055.

Zhang, H., "Atomic Layer Deposition of High Dielectric Constant Nanolaminates", *Journal of The Electrochemical Society*, 148(4), (Apr. 2001),F63-F66.

Zhang, H, "High permittivity thin film nanolaminates", *Journal of Applied Physics*, 87(4), (Feb. 2000), 1921-1924.

Zhu, W, et al., "HfO2 and HfAlO for CMOS: Thermal Stability and Current Transport", *IEEE International Electron Device Meeting 2001*, 463-466.

Ahn, Kie Y., "Gallium Lanthanide Oxide Films", (U.S. Appl. No. 11/329,025, filed Jan. 10, 2006.

Ahn, Kie Y., et al., "Lanthanide Yttrium Aluminum Oxide Dielectric Films", U.S. Appl. No. 11/297,567, filed Dec. 8, 2005.

Choi, Rino, et al., "High-Quality Ultra-thin $HfO_2$ Gate Dielectric MOSFETs with TaN Electrode and Nitridation Surface Properties", *2001 Symposium on VLSI Technology Digest of Technical Papers*, (2001), 15-16.

Conley, J. F., "Atomic Layer Deposition of Hafnium Oxide Using Anhydrous Hafnium Nitrate", *Electrochemical and Solid-State Letters*, 5(5), (May 2002),C57-C59.

Fang, Q., et al., "Investigation of TiO2-dp[ed HfO2 thin films deposited by photo-CVD", *Thin Solid Films 428*, (2003),263-268.

Herman, Marian, "Atomic layer epitaxy—12 years later", *Vacuum*, vol. 42, No. 1-2, (1991),61-66.

Kim, Hyoungsub, et al., "Effects of crystallization on the electrical properties of ultrathin HfO2 dielectrics grown by atomic layer deposition", *Applied Physics Letters*, vol. 82, No. 1, (Jan. 6, 2003), 106-108.

Kukli, Kaupo, "Tailoring the dielectric properties of HfO2-Ta2O3 nanolaminates", *Appl. Phys. Lett.*, 68, (1996),3737-3739.

Leskela, M, "ALD precursor chemistry: Evolution and future challenges", *Journal de Physique IV (Proceedings)*, 9(8), (Sep. 1999),837-852.

Nalwa, H. S., "Handbook of Thin Film Materials", *Deposition and Processing of thin Films*, vol. 1, San Diego : Academic Press,(2002),114-119.

Ohring, Milton, "The Materials Science of Thin Films", *Boston : Academic Press*, (1992),118,121,125.

Ritala, M., "Atomic layer deposition of oxide thin films with metal alkoxides as oxygen sources", *Science*, 288(5464), (Apr. 14, 2000),319-321.

Ritala, Mikko, "Atomic Layer Epitaxy Growth of Titanium, Zirconium and Hafnium Dioxide Thin Films", *Annales Academiae Scientiarum Fennicae*, (1994),24-25.

Ruh, Robert, et al., "Phase Relations and Thermal Expansion in the System $HfO_2$-$TiO_2$", *J. Am. Ceramic Soc.*, 59, (Nov.-Dec. 1976),495-499.

\* cited by examiner

ELECTRONIC APPARATUS WITH DEPOSITED DIELECTRIC LAYERS

CROSS REFERENCE TO RELATED APPLICATIONS

The present application is a divisional of U.S. application Ser. No. 10/379,470, filed Mar. 4, 2003, now U.S. Pat. No. 7,192,892, which is herein incorporated by reference in its entirety.

This application is related to the following commonly assigned U.S. patent applications, which are herein incorporated by reference in their entirety:

U.S. application Ser. No. 10/137,058, filed May 2, 2002, entitled "Atomic Layer Deposition and Conversion"; U.S. application Ser. No. 10/137,168, filed May 2, 2002, now issued as U.S. Pat. No. 7,160,577, entitled "Methods, for Atomic-Layer Deposition of Aluminum Oxides in Integrated Circuits"; and U.S. application Ser. No. 09/797,324, filed Mar. 1, 2001, now issued as U.S. Pat. No. 6,852,167, entitled "Methods, Systems, and Apparatus for Uniform Chemical-Vapor Depositions."

TECHNICAL FIELD

This application relates generally to semiconductor devices and device fabrication and, more particularly, to dielectric layers and their method of fabrication.

BACKGROUND

The semiconductor device industry has a market driven need to improve speed performance, improve its low static (off-state) power requirements, and adapt to a wide range of power supply and output voltage requirements for its silicon based microelectronic products. In particular, in the fabrication of transistors, there is continuous pressure to reduce the size of devices such as transistors. The ultimate goal is to fabricate increasingly smaller and more reliable integrated circuits (ICs) for use in products such as processor chips, mobile telephones, and memory devices such as dynamic random access memories (DRAMs). The smaller devices are frequently powered by batteries. There is also pressure to reduce the size of the batteries, and to extend the time between battery charges. This forces the industry to not only design smaller transistors, but to design them to operate reliably with lower power supplies.

Currently, the semiconductor industry relies on the ability to reduce or scale the dimensions of its basic devices, primarily, the silicon based metal-oxide-semiconductor field effect transistor (MOSFET). A common configuration of such a transistor is shown in FIG. 1A. While the following discussion uses FIG. 1A to illustrate a transistor from the prior art, one skilled in the art will recognize that the present subject matter could be incorporated into the transistor shown in FIG. 1A to form a transistor according to the present subject matter. A transistor 100 is fabricated in a substrate 110 that is typically silicon, but could be fabricated from other semiconductor materials as well. Transistor 100 has a source region 120 and a drain region 130. A body region 132 is located between source region 120 and drain region 130, where body region 132 defines a channel of the transistor with a channel length 134. A gate dielectric 140 is located on body region 132 with a gate 150 located over gate dielectric 140. Although gate dielectric 140 may be formed from materials other than oxides, gate dielectric 140 is typically an oxide, and is commonly referred to as a gate oxide. Gate 150 may be fabricated from polycrystalline silicon (polysilicon), or other conducting materials such as metal may be used.

In fabricating transistors to be smaller in size and reliably operate on lower power supplies, one design criteria is gate dielectric 140. The mainstay for forming the gate dielectric has been silicon dioxide, $SiO_2$. A thermally grown amorphous $SiO_2$ layer provides an electrically and thermodynamically stable material, where the interface of the $SiO_2$ layer with underlying Si provides a high quality interface as well as superior electrical isolation properties. In typical processing, use of $SiO_2$ on Si has provided defect charge densities on the order of $10^{10}/cm^2$, midgap interface state densities of approximately $10^{10}/cm^2$ eV, and breakdown voltages in the range of 15 MV/cm. With such qualities, there would be no apparent need to use a material other than $SiO_2$, but increased scaling and other requirements for gate dielectrics create the need to find other dielectric materials to be used for a gate dielectric.

SUMMARY

The abovementioned problems are addressed by the present subject matter and will be understood by reading and studying the following specification. An embodiment for a method for forming a dielectric layer includes forming a layer of metal on a substrate by atomic layer deposition and forming a layer of an oxide of the metal, by atomic layer deposition, on the layer of metal. In an embodiment, a layer of hafnium is formed on a substrate by atomic layer deposition, and a layer of hafnium oxide is formed on the hafnium by atomic layer deposition. In an embodiment, the layer of hafnium is formed using at most ten atomic layer deposition cycles. In an embodiment, the number of atomic layer deposition cycles to form the layer of hafnium ranges from about four cycles to about ten cycles.

A dielectric layer containing hafnium oxide has a larger dielectric constant than silicon dioxide, a relatively small leakage current, and good stability with respect to a silicon based substrate. Such dielectric layers provide a significantly thinner equivalent oxide thickness compared with a silicon oxide layer having the same physical thickness. Alternately, such dielectric layers provide a significantly thicker physical thickness than a silicon oxide layer having the same equivalent oxide thickness. Embodiments include structures for capacitors, transistors, memory devices, and electronic systems with dielectric layers containing atomic layer deposited hafnium oxide, and methods for forming such structures.

These and other aspects, embodiments, advantages, and features will become apparent from the following description and the referenced drawings.

DETAILED DESCRIPTION

The following detailed description refers to the accompanying drawings that show, by way of illustration, specific aspects and embodiments in which the present subject matter may be practiced. These embodiments are described in sufficient detail to enable those skilled in the art to practice the present subject matter. Other embodiments may be utilized and structural, logical, and electrical changes may be made without departing from the scope of the present subject matter. The various embodiments disclosed herein are not necessarily mutually exclusive, as some disclosed embodiments can be combined with one or more other disclosed embodiments to form new embodiments.

The terms wafer and substrate used in the following description include any structure having an exposed surface with which to form the integrated circuit (IC) structure of the present subject matter. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present subject matter is defined only by the appended claims, along with the full scope of equivalents to which such claims are entitled.

Figure 1A:
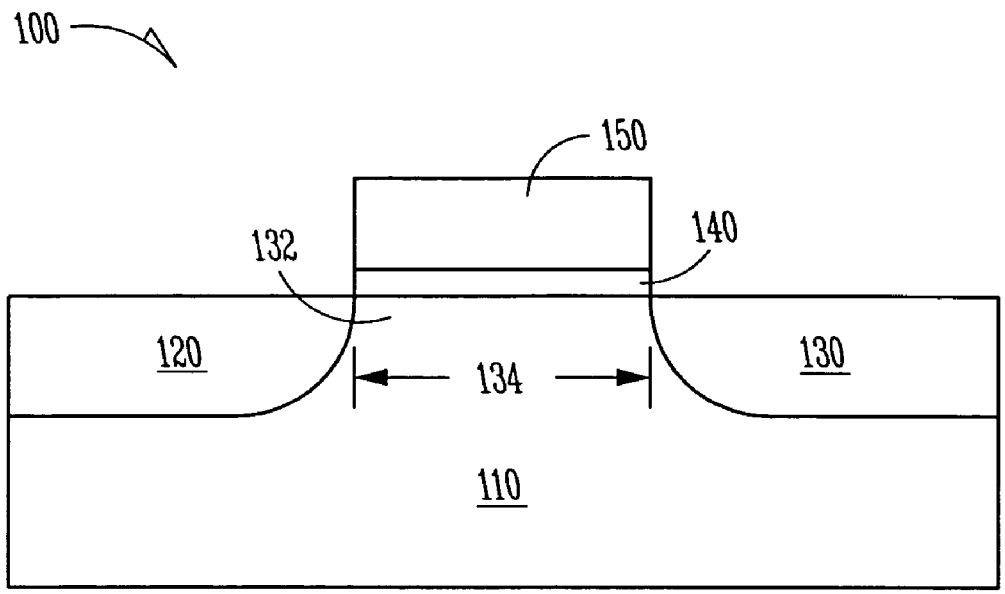
FIG. 1A shows a common configuration of a transistor in which a gate dielectric containing atomic layer deposited hafnium oxide may be formed according to various embodiments of the present subject matter.

A gate dielectric 140 of FIG. 1A, when operating in a transistor, has both a physical gate dielectric thickness and an equivalent oxide thickness ($t_{eq}$). The equivalent oxide thickness quantifies the electrical properties, such as capacitance, of a gate dielectric 140 in terms of a representative physical thickness. The equivalent oxide thickness, $t_{eq}$ is defined as the thickness of a theoretical $SiO_2$ layer that would have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region may result in $t_{eq}$ being from 3 to 6 Angstroms (Å) larger than the $SiO_2$ thickness, t. Thus, with the semiconductor industry driving to scale the gate dielectric equivalent oxide thickness to under 10 Å, the physical thickness for a $SiO_2$ layer used for a gate dielectric would be need to be approximately 4 to 7 Å.

Additional characteristics for a $SiO_2$ layer depend on the gate electrode used in conjunction with the $SiO_2$ gate dielectric. Using a conventional polysilicon gate results in an additional increase in $t_{eq}$ for the $SiO_2$ layer. This additional thickness could be eliminated by using a metal gate electrode, though metal gates are not currently used in typical complementary metal-oxide-semiconductor field effect transistor (CMOS) technology. Thus, future devices would be designed towards a physical $SiO_2$ gate dielectric layer of about 5 Å or less. Such a small thickness for a $SiO_2$ oxide layer creates additional problems.

Silicon dioxide is used as a gate dielectric, in part, due to its electrical isolation properties in a $SiO_2$—Si based structure. This electrical isolation is due to the relatively large band gap of $SiO_2$ (8.9 eV) making it a good insulator from electrical conduction. Signification reductions in its band gap would eliminate it as a material for a gate dielectric. As the thickness of a $SiO_2$ layer decreases, the number of atomic layers, or monolayers of the $SiO_2$ decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers will not form a full band gap. The lack of a full band gap in a $SiO_2$ gate dielectric could cause an effective short between an underlying Si channel and an overlying polysilicon gate. This undesirable property sets a limit on the physical thickness to which a $SiO_2$ layer may be scaled. The minimum thickness due to this monolayer effect is thought to be about 7-8 Å. Therefore, for future devices to have a $t_{eq}$ less than about 10 Å, dielectrics other than $SiO_2$ need to be considered for use as a gate dielectric.

For a typical dielectric layer used as a gate dielectric, the capacitance is determined as one for a parallel plate capacitance: $C=\kappa\epsilon_0 A/t$, where $\kappa$ is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $\kappa_{ox}=3.9$, as $$t=(\kappa/\kappa_{ox})\,t_{eq}=(\kappa/3.9)\,t_{eq}.$$

Thus, materials with a dielectric constant greater than that of $SiO_2$, 3.9, will have a physical thickness that may be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced equivalent oxide thickness for transistors may be realized by using dielectric materials with higher dielectric constants than $SiO_2$.

The thinner equivalent oxide thickness for lower transistor operating voltages and smaller transistor dimensions may be realized by a significant number of materials, but additional fabricating characteristics makes determining a suitable replacement for $SiO_2$ difficult. However, the current view for the microelectronics industry is still for Si based devices. Thus, the gate dielectric employed will grow on a silicon substrate or silicon layer, which places significant restraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness of the dielectric being formed, written as $$t_{eq} = t_{SiO2} + (\kappa_{ox}/\kappa)t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer interfacing with the silicon layer must provide a high quality interface to maintain a high channel carrier mobility.

One of the advantages for using $SiO_2$ as a gate dielectric has been that the formation of the $SiO_2$ layer results in an amorphous gate dielectric. Having an amorphous structure for a gate dielectric is advantageous because grain boundaries in polycrystalline gate dielectrics provide high leakage paths. Additionally, grain size and orientation changes throughout a polycrystalline gate dielectric may cause variations in the layer's dielectric constant. Many materials having a high dielectric constant relative to $SiO_2$ also have a disadvantage of a crystalline form, at least in a bulk configuration. Thus, the best candidates for replacing $SiO_2$ as a gate dielectric are those with high dielectric constant and are able to be fabricated as a thin layer with an amorphous form.

An embodiment for a method for forming a dielectric layer includes forming a layer of metal on a substrate by atomic layer deposition and forming a layer of an oxide of the metal, by atomic layer deposition, on the layer of metal. In an embodiment, a layer of hafnium is formed on a substrate by atomic layer deposition, and a layer of hafnium oxide is formed on the hafnium by atomic layer deposition. In an embodiment, the layer of hafnium is formed using at most ten atomic layer deposition cycles. In an embodiment, the number of atomic layer deposition cycles to form the layer of hafnium ranges from about four cycles to about ten cycles.

A dielectric layer containing hafnium oxide has a larger dielectric constant than silicon dioxide, a relatively small leakage current, and good stability with respect to a silicon based substrate. Such dielectric layers provide a significantly thinner equivalent oxide thickness compared with a silicon oxide layer having the same physical thickness. Alternately, such dielectric layers provide a significantly thicker physical thickness than a silicon oxide layer having the same equivalent oxide thickness. Embodiments include structures for capacitors, transistors, memory devices, and electronic systems with dielectric layers containing atomic layer deposited hafnium oxide, and methods for forming such structures.

Based solely on the size of the dielectric constant, hafnium oxide, $HfO_2$, with a bulk dielectric constant of about 25, appears to be a candidate for replacing $SiO_2$. However, other considerations for selecting the material and method for forming a dielectric layer for use in electronic devices and systems concern the suitability of the material for applications requiring that the dielectric layer have an ultra-thin equivalent oxide thickness, form conformally on a substrate, and/or be engineered to specific thickness and elemental concentrations. Another consideration concerns the roughness of the dielectric layer on a substrate. Surface roughness of the dielectric layer has a significant effect on the electrical properties of the gate oxide, and the resulting operating characteristics of the transistor. Leakage current through a physical 1.0 nm gate oxide has been found to be increased by a factor of 10 for every 0.1 increase in the root-mean-square (RMS) roughness.

During a conventional sputtering deposition process stage, particles of the material to be deposited bombard the surface at a high energy. When a particle hits the surface, some particles adhere, and other particles cause damage. High-energy impacts remove body region particles creating pits. The surface of such a deposited layer may have a rough contour due to the rough interface at the body region.

In an embodiment, a hafnium oxide dielectric layer having a substantially smooth surface relative to other processing techniques is formed using atomic layer deposition (ALD). Further, forming a dielectric layer using atomic layer deposition provides for controlling transitions between material layers. Thus, atomic layer deposited hafnium oxide dielectric layers may have an engineered transition with a substrate surface that has a substantially reduced or no interfacial $SiO_2$ layer. Further, the ALD deposited hafnium oxide dielectric layers provide conformal coverage on the surfaces on which they are deposited.

ALD, also known as atomic layer epitaxy (ALE), was developed in the early 1970's as a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. Between the pulses, the reaction chamber is purged with a gas, which in many cases is an inert gas, and/or evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired layer takes place. Subsequent to the layer growth reaction, reaction by-products and precursor excess are purged from the reaction chamber. With favourable precursor chemistry where the precursors adsorb and react with each other on the substrate aggressively, one ALD cycle may be performed in less than one second in properly designed flow type reaction chambers. Typically, precursor pulse times range from about 0.5 sec to about 2 to 3 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Thus, ALD provides for controlling layer thickness in a straightforward manner by controlling the number of growth cycles.

ALD was originally developed to manufacture luminescent and dielectric layers needed in electroluminescent displays. Significant efforts have been made to apply ALD to the growth of doped zinc sulfide and alkaline earth metal sulfide layers. Additionally, ALD has been studied for the growth of different epitaxial II-V and II-VI layers, nonepitaxial crystalline or amorphous oxide and nitride layers and multilayer structures of these. There also has been considerable interest towards the ALD growth of silicon and germanium layers, but due to the difficult precursor chemistry, this has not been very successful.

The precursors used in an ALD process may be gaseous, liquid or solid. However, liquid or solid precursors must be volatile. The vapor pressure must be high enough for effective mass transportation. Also, solid and some liquid precursors need to be heated inside the reaction chamber and introduced through heated tubes to the substrates. The necessary vapor pressure must be reached at a temperature below the substrate temperature to avoid the condensation of the precursors on the substrate. Due to the self-limiting growth mechanisms of ALD, relatively low vapor pressure solid precursors may be used though evaporation rates may somewhat vary during the process because of changes in their surface area.

There are several other characteristics for precursors used in ALD. The precursors must be thermally stable at the substrate temperature because their decomposition would destroy the surface control and accordingly the advantages of the ALD method that relies on the reaction of the precursor at the substrate surface. A slight decomposition, if slow compared to the ALD growth, may be tolerated.

The precursors have to chemisorb on or react with the surface, though the interaction between the precursor and the surface as well as the mechanism for the adsorption is different for different precursors. The molecules at the substrate surface must react aggressively with the second precursor to form the desired solid layer. Additionally, precursors should not react with the layer to cause etching, and precursors should not dissolve in the layer. Using highly reactive precursors in ALD contrasts with the selection of precursors for conventional CVD.

The by-products in the reaction must be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. The metal precursor reaction at the substrate is typically followed by an inert gas pulse to remove excess precursor and by-products from the reaction chamber prior to pulsing the next precursor of the fabrication sequence.

By RS-ALD, layers can be layered in equal metered sequences that are all identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle may be realized.

The characteristics of RS-ALD include continuity at an interface, conformality over a substrate, use of low temperature and mildly oxidizing processes, freedom from first wafer effects and chamber dependence, growth thickness dependent solely on the number of cycles performed, and ability to engineer multilayer laminate layers with resolution of one to two monolayers. RS-ALD allows for deposition control on the order on monolayers and the ability to deposit monolayers of amorphous layers.

Herein, a sequence refers to the ALD material formation based on an ALD reaction of a precursor or a precursor with its reactant precursor. For example, forming a metal layer from a precursor containing the metal forms an embodiment of a metal sequence. Additionally, forming a layer of metal oxide from a precursor containing the metal and from an oxygen containing precursor as its reactant precursor forms an embodiment of a metal/oxygen sequence, which may be referred to as the metal oxide sequence. A cycle of the metal sequence includes pulsing a precursor containing the metal and pulsing a purging gas for the precursor. Further, a cycle of the metal oxide sequence includes pulsing a precursor containing the metal, pulsing a purging gas for the precursor, pulsing a reactant precursor, and pulsing a purging gas for the reactant precursor.

In an embodiment, a layer of hafnium oxide is formed on a substrate mounted in a reaction chamber by ALD using precursor gases individually pulsed into the reaction chamber. Alternately, solid or liquid precursors may be used in an appropriately designed reaction chamber. ALD formation of other materials is disclosed in co-pending, commonly assigned U.S. patent application: entitled "Atomic Layer Deposition and Conversion," Ser. No. 10/137,058, and "Methods, Systems, and Apparatus for Atomic-Layer Deposition of Aluminum Oxides in Integrated Circuits," Ser. No. 10/137,168.

Figure 2A:
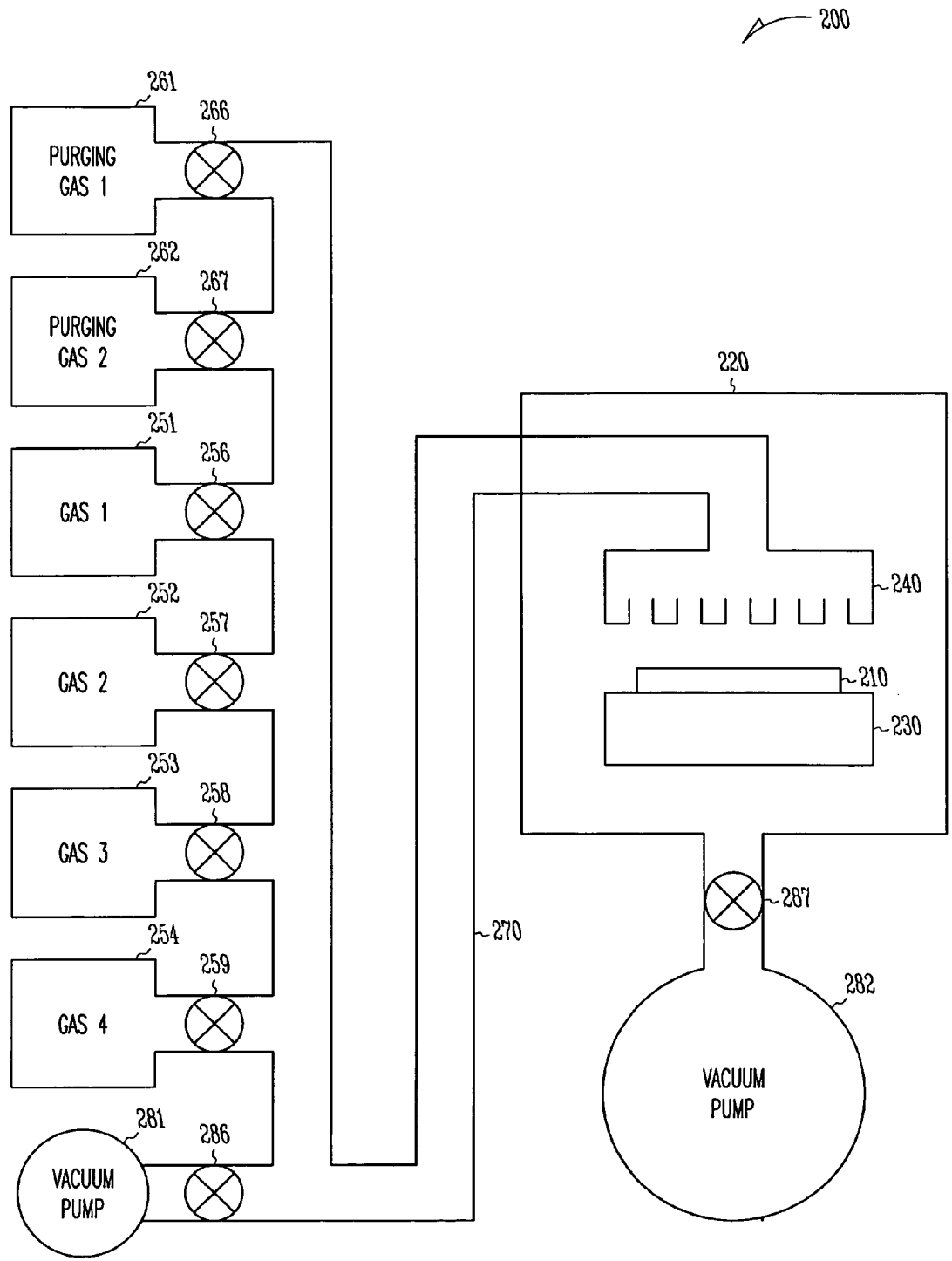
FIG. 2A shows an atomic layer deposition system for processing a dielectric layer containing hafnium oxide, according to various embodiments of the present subject matter.

FIG. 2A shows an embodiment of an atomic layer deposition system 200 for processing a dielectric layer containing hafnium oxide. The elements depicted are those elements necessary for discussion of embodiments of the present subject matter such that those skilled in the art may practice various embodiments of the present subject matter without undue experimentation. A further discussion of the ALD reaction chamber can be found in co-pending, commonly assigned U.S. patent application: entitled "Methods, Systems, and Apparatus for Uniform Chemical-Vapor Depositions," Ser. No. 09/797,324, incorporated herein by reference.

In FIG. 2A, a substrate 210 is located inside a reaction chamber 220 of ALD system 200. Also located within reaction chamber 220 is a heating element 230, which is thermally coupled to substrate 210 to control the substrate temperature. A gas-distribution fixture 240 introduces precursor gases to the substrate 210. Each precursor gas originates from individual gas sources 251-254 whose flow is controlled by mass-flow controllers 256-259, respectively. Each gas source, 251-254, provides a precursor gas either by storing the precursor as a gas or by providing a location and apparatus for evaporating a solid or liquid material to form the selected precursor gas. Furthermore, additional gas sources may be included, one for each metal precursor employed and one for each reactant precursor associated with each metal precursor.

Also included in the ALD system are purging gas sources 261, 262, each of which is coupled to mass-flow controllers 266, 267, respectively. Furthermore, additional purging gas sources may be constructed in ALD system 200, one purging gas source for each precursor gas. For a process that uses the same purging gas for multiple precursor gases less purging gas sources are used in ALD system 200. Gas sources 251-254 and purging gas sources 261-262 are coupled by their associated mass-flow controllers to a common gas line or conduit 270, which is coupled to the gas-distribution fixture 240 inside reaction chamber 220. Gas conduit 270 is also coupled to vacuum pump, or exhaust pump, 281 by mass-flow controller 286 to remove excess precursor gases, purging gases, and by-product gases at the end of a purging sequence from gas conduit 270.

Vacuum pump, or exhaust pump, 282 is coupled by mass-flow controller 287 to remove excess precursor gases, purging gases, and by-product gases at the end of a purging sequence from reaction chamber 220. For convenience, control displays, mounting apparatus, temperature sensing devices, substrate maneuvering apparatus, and necessary electrical connections as are known to those skilled in the art are not shown in FIG. 2A.

Figure 2B:
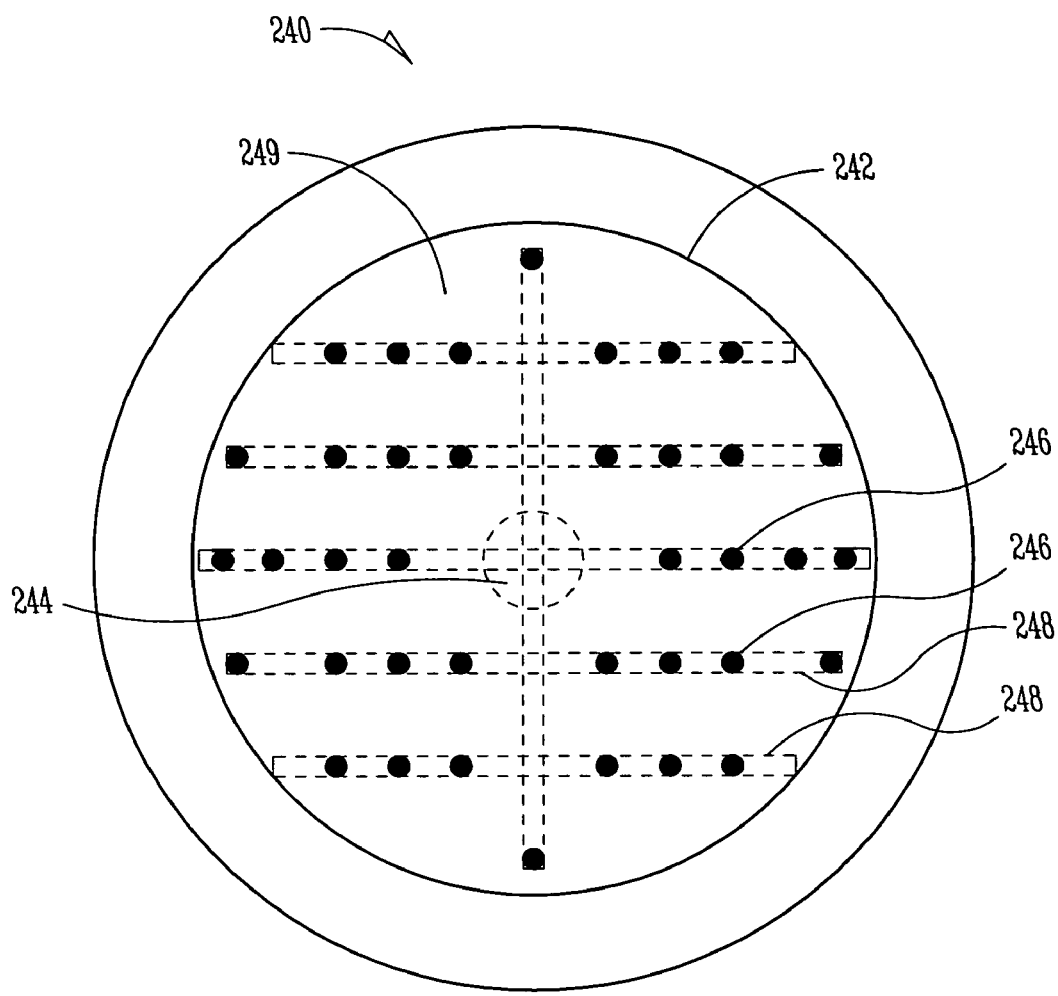
FIG. 2B shows a gas-distribution fixture of an atomic layer deposition system for processing a dielectric layer containing hafnium oxide, according to various embodiments of the present subject matter.

FIG. 2B shows an embodiment of a gas-distribution fixture 240 of atomic layer deposition system 200 for processing a dielectric layer containing hafnium oxide. Gas-distribution fixture 240 includes a gas-distribution member 242, and a gas inlet 244. Gas inlet 244 couples gas-distribution member 242 to gas conduit 270 of FIG. 2A. Gas-distribution member 242 includes gas-distribution holes, or orifices, 246 and gas-distribution channels 248. In the illustrated embodiment, holes 246 are substantially circular with a common diameter in the range of 15-20 microns, gas-distribution channels 248 have a common width in the range of 20-45 microns. The surface 249 of gas distribution member 242 having gas-distribution holes 246 is substantially planar and parallel to substrate 210 of FIG. 2A. However, other embodiments use other surface forms as well as shapes and sizes of holes and channels. The distribution and size of holes may also affect deposition thickness and thus might be used to assist thickness control. Holes 246 are coupled through gas-distribution channels 248 to gas inlet 244. Though ALD system 200 is well suited for practicing the present subject matter, other ALD systems commercially available may be used.

Those of ordinary skill in the art of semiconductor fabrication understand the use, construction and fundamental operation of reaction chambers for deposition of material layers. Embodiments of the present subject matter may be practiced on a variety of such reaction chambers without undue experimentation. Furthermore, one of ordinary skill in the art will comprehend the necessary detection, measurement, and control techniques in the art of semiconductor fabrication upon reading the disclosure.

The elements of ALD system 200 may be controlled by a computer. To focus on the use of ALD system 200 in the various embodiments of the present subject matter, the computer is not shown. Those skilled in the art can appreciate that the individual elements such as pressure control, temperature control, and gas flow within ALD system 200 may be under computer control. In an embodiment, a computer executes instructions stored in a computer readable medium to accurately control the integrated functioning of the elements of ALD system 200 to form a dielectric layer.

Figure 1B:
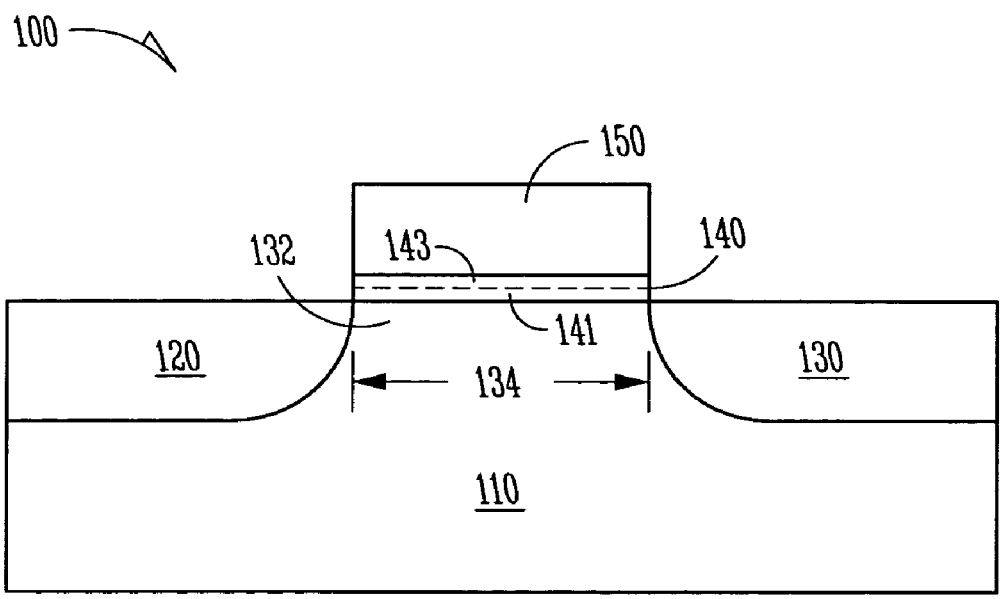
FIG. 1B shows an embodiment of a stage of forming a gate dielectric layer of a transistor according to an embodiment of the present subject matter.
Figure 3:
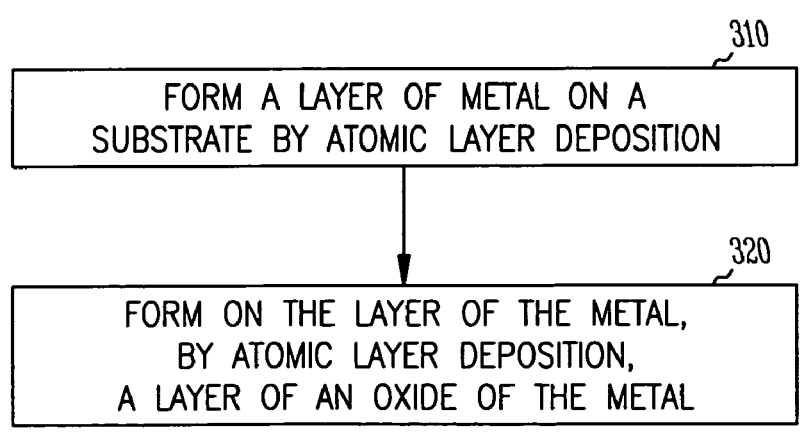
FIG. 3 illustrates a flow diagram of elements for an embodiment of a method to process a dielectric layer by atomic layer deposition, according to various embodiments of the present subject matter.

FIG. 3 illustrates a flow diagram of elements for an embodiment of a method to process a dielectric layer by atomic layer deposition. For an example of the embodiment of the method of FIG. 3, FIG. 1B shows an embodiment of a stage of forming gate dielectric layer 140 of transistor 100 according to an embodiment. The elements of FIG. 3 are not limited to forming a gate dielectric of a transistor. This embodiment includes forming a layer of a metal 141 on a substrate by atomic layer deposition, at block 310, and forming on the layer of metal 141, by atomic layer deposition, a layer of an oxide of the metal 143, at block 320. In an embodiment, the layer of metal 141 is formed through performing at most ten cycles of the metal sequence. In an embodiment, the layer of metal 141 is formed through performing from four cycles to ten cycles of the metal sequence. The number of cycles for the metal oxide sequence to be performed is selected to provide a desired thickness of the metal oxide 140.

In an embodiment, a hafnium layer is formed on a substrate by atomic layer deposition. The hafnium is deposited on the substrate using a hafnium nitrate precursor. In an embodiment, at most ten cycles are performed using the hafnium nitrate precursor. After completion of forming hafnium on the substrate, a predetermined number of cycles of a hafnium oxide sequence are performed. At the conclusion of forming the predetermined number of cycles for the hafnium oxide sequence, a hafnium oxide layer on the substrate results. With a process conducted where the formation of a hafnium layer is followed by forming a hafnium oxide layer, a Hf/HfO$_2$ nanolaminate is fabricated. However, oxygen diffusing towards the silicon substrate during the HfO$_2$ formation interacts with the hafnium layer that prevents formation of a silicon oxide interfacial region.

Performing each atomic layer deposition includes pulsing one or more precursors into a reaction chamber for a predetermined period. The predetermined period is individually controlled for each precursor pulsed into the reaction chamber. Further the substrate is maintained at a selected temperature for each pulsing of a precursor, where the selected temperature is set independently for pulsing each precursor. Additionally, each precursor may be pulsed into the reaction under separate environmental conditions. Appropriate temperatures and pressures are maintained dependent on the nature of the precursor, whether the precursor is a single precursor or a mixture of precursors.

Using atomic layer deposition, the pulsing of the precursor gases is separated by purging the reaction chamber with a purging gas following each pulsing of a precursor. In an embodiment, nitrogen gas is used as the purging gas following the pulsing of each precursor used in a cycle to form a layer of hafnium oxide. Additionally, the reaction chamber may also be purged by evacuating the reaction chamber.

Figure 4:
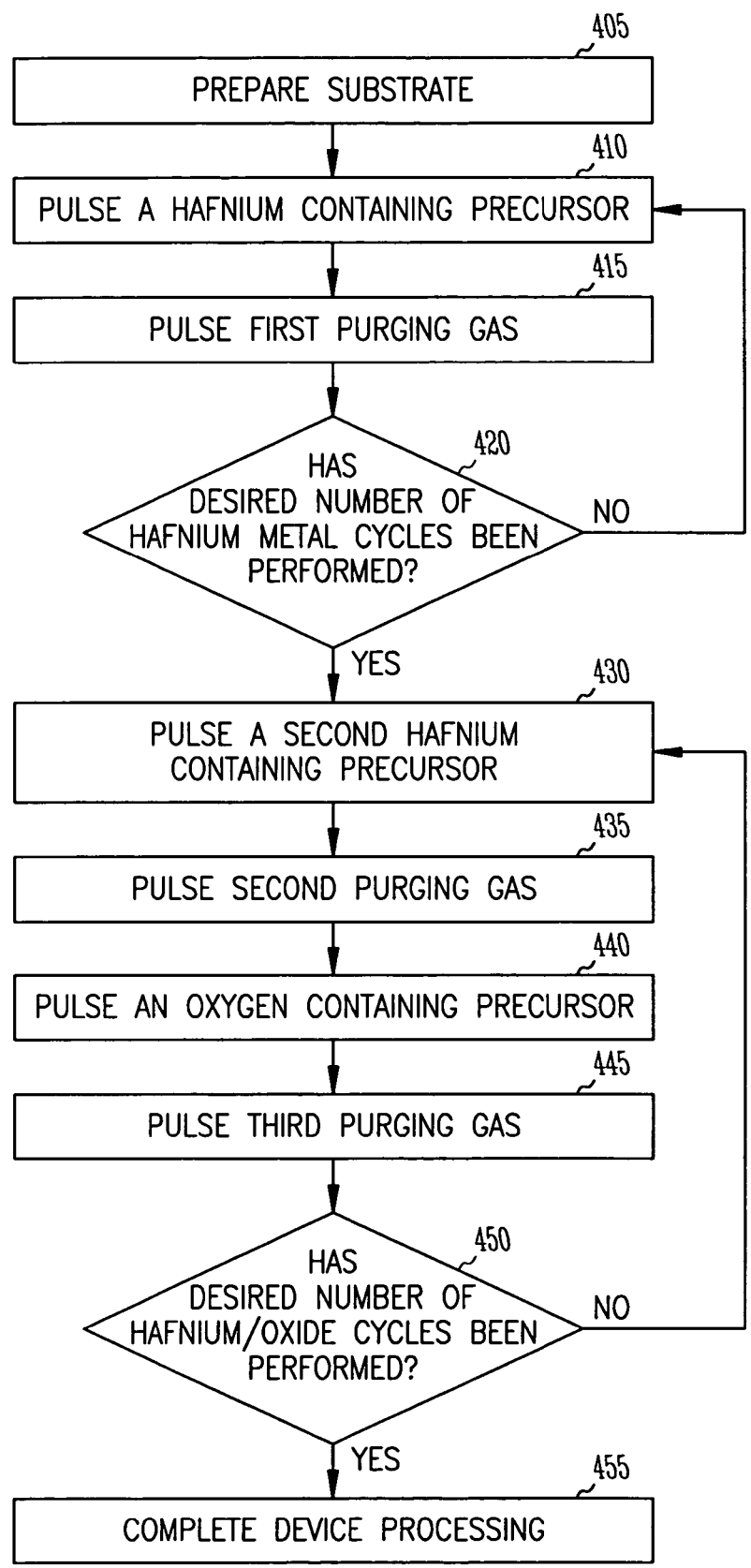
FIG. 4 illustrates a flow diagram of elements for an embodiment of a method to process a dielectric layer containing hafnium oxide by atomic layer deposition, according to various embodiments of the present subject matter.

FIG. 4 illustrates a flow diagram of elements for an embodiment of a method to process a dielectric layer containing hafnium oxide by atomic layer deposition. This embodiment may be implemented with the atomic layer deposition system 200 of FIG. 2A, B.

At block 405, substrate 210 is prepared. The substrate used for forming a transistor is typically a silicon or silicon containing material. In other embodiments, germanium, gallium arsenide, silicon-on-sapphire substrates, or other suitable substrates may be used. This preparation process may include cleaning of substrate 210 and forming layers and regions of the substrate, such as drains and sources of a metal oxide semiconductor (MOS) transistor, prior to forming a gate dielectric. In an embodiment, the substrate is cleaned to provide an initial substrate depleted of its native oxide. In an embodiment, the initial substrate is cleaned to also provide a hydrogen-terminated surface. In an embodiment, a silicon substrate undergoes a final HF rinse prior to ALD processing to provide the silicon substrate with a hydrogen-terminated surface without a native silicon oxide layer.

The sequencing of the formation of the regions of the transistor being processed follows typical sequencing that is generally performed in the fabrication of a MOS transistor as is well known to those skilled in the art. Included in the processing is the masking of substrate regions to be protected during the gate dielectric formation, as is typically performed in MOS fabrication. In this embodiment, the unmasked region may include a body region of a transistor; however one skilled in the art will recognize that other semiconductor device structures may utilize this process. Additionally, substrate 210 in its ready for processing form is conveyed into a position in reaction chamber 220 for ALD processing.

At block 410, a hafnium containing precursor is pulsed into reaction chamber 220. In an embodiment, anhydrous hafnium nitrate, $Hf(NO_3)_4$, is used as a precursor. The $Hf(NO_3)_4$ precursor is pulsed into reaction chamber 220 through the gas-distribution fixture 240 on substrate 210. Mass-flow controller 256 regulates the flow of the $Hf(NO_3)_4$ from gas source 251. In an embodiment, the substrate temperature is maintained at about 180° C. In another embodiment, the substrate temperature is maintained between about 300° C. and about 500° C. The $Hf(NO_3)_4$ reacts with the surface of the substrate 210 in the desired region defined by the unmasked areas of the substrate 210.

In other embodiments, a hafnium containing precursor includes a hafnium-tetrachloride precursor. Although excellent uniformity and initiation of deposition is provided with hafnium-tetrachloride precursors, a number of ALD cycles are used to produce total coverage of a hydrogen-terminated silicon surface since the displacement of Si—H bonds with the tetrachloride species is not easily achieved. This difficulty related to initiation of deposition on hydrogen-terminated silicon can lead to surface roughness and deposition inconsistencies. Moreover, the metal tetrachloride also has a tendency to incorporate trace amounts of chlorine in a layer, which can lead to stability and reliability problems.

Anhydrous nitrates of hafnium allows for better control of the initiation of the deposition on hydrogen-terminated silicon, which aids in optimizing the interface properties and improvement of the carrier mobility in transistors. These precursors do not leave hydrocarbons or halogen impurities, and the nitrogen oxide by-products are easily removed.

At block 415, a first purging gas is pulsed into reaction chamber 220. In an embodiment, nitrogen with a purity of about 99.999% is used as a purging gas. Mass-flow controller 266 regulates the nitrogen flow from the purging gas source 261 into the gas conduit 270. Using the pure nitrogen purge avoids overlap of the precursor pulses and possible gas phase reactions. Following the purge, a cycle of the hafnium metal sequence is completed. Then, a determination is made as to whether the desired number of hafnium metal cycles has been performed, at block 420. If the desired number of cycles for the hafnium metal sequence has not been completed, the process returns to pulsing the hafnium containing precursor onto the substrate, at block 410. If the desired number of cycles for the hafnium metal sequence had been completed, the process moves to forming a hafnium oxide on the hafnium layer.

In an embodiment, the desired number of cycles for the hafnium metal sequence is a number of cycles to form a hafnium metal layer across the substrate providing a thickness of a few angstroms. In an embodiment, performing about four to ten cycles provides a few angstroms thickness. In another embodiment, performing about ten cycles provides the hafnium metal thickness. In an embodiment, each cycle for the hafnium sequence includes pulsing the hafnium nitrate for about 0.6 s, and pulsing the nitrogen purging gas for about 0.6 s. Forming the hafnium metal layer on the substrate prior to forming a hafnium oxide prevents oxygen from diffusing to the silicon surface during subsequent ALD formation of the hafnium oxide. As the hafnium oxide is being formed by ALD, oxygen that diffuses towards the silicon substrate interacts with the hafnium metal layer. In an embodiment, the hafnium layer substantially becomes hafnium oxide.

Following the completion for forming a layer of hafnium metal on substrate 210, a second hafnium containing precursor is pulsed onto substrate 210, at block 430. In an embodiment, anhydrous hafnium nitrate, $Hf(NO_3)_4$, is used as a precursor. The $Hf(NO_3)_4$ precursor is pulsed into reaction chamber 220 through the gas-distribution fixture 240 on substrate 210. Mass-flow controller 257 regulates the flow of the $Hf(NO_3)_4$ from gas source 252. In an embodiment, the substrate temperature is maintained at about 180° C. In another embodiment, the substrate temperature is maintained between about 300° C. and about 500° C. The $Hf(NO_3)_4$ reacts with at the surface of substrate 210 on which the hafnium metal layer was formed in the desired region defined by the unmasked areas of the substrate 210.

After pulsing the hafnium containing precursor, a second purging gas is pulsed, at block, 435. In an embodiment, nitrogen is used as the second purging gas. Excess precursor gas, and reaction by-products are removed from the system by the purge gas in conjunction with the exhausting of reaction chamber 220 using vacuum pump 282 through mass-flow controller 287, and exhausting of the gas conduit 270 by the vacuum pump 281 through mass-flow controller 286.

After pulsing the second purging gas, an oxygen containing precursor is pulsed into reaction chamber 220, at block 440. In an embodiment, the oxygen containing precursor is water vapor. The $H_2O$ vapor precursor is pulsed into reaction chamber 220 through the gas-distribution fixture 240 on substrate 210. Mass-flow controller 258 regulates the flow of the $H_2O$ vapor from gas source 253. In an embodiment, the substrate temperature is maintained at about 180° C. In another embodiment, the substrate temperature is maintained between about 300° C. and about 500° C. The water vapor aggressively reacts at the current surface of substrate 210.

At block 445, a third purging gas is introduced into the system. Nitrogen gas may also be used as a purging and carrier gas. The nitrogen flow is controlled by mass-flow controller 267 from the purging gas source 262 into the gas conduit 270 and subsequently into reaction chamber 220. In another embodiment, argon gas may be used as the purging gas.

During an $Hf(NO_3)_4$/water vapor sequence, the substrate is held between at about 180° C. by the heating element 230. The $Hf(NO_3)_4$ is pulsed for about 0.6 s. After the $Hf(NO_3)_4$ pulse, the hafnium oxide sequence continues with a purge pulse followed by a water vapor pulse followed by a purge pulse. In an embodiment, the hafnium/oxygen sequence includes a 0.6 s $Hf(NO_3)_4$ pulse, a 0.6 s nitrogen pulse, a 0.6 s water vapor pulse, and a 0.6 s nitrogen pulse. Other embodiments include pulse periods that range from about 0.2 s to several seconds for the precursors and pulse periods that range from about 0.5 s to about 20 s for purging gases.

At block 450, a determination is made as to whether a desired number of cycles has been performed, that is, whether the number of completed cycles is equal to a predetermined number. The predetermined number corresponds to a predetermined thickness for the ALD hafnium oxide dielectric layer. If the number of completed cycles is less than the predetermined number, the second hafnium containing precursor is pulsed into reaction chamber 220, at block 430, and the process continues. If the total number of cycles to form the desired thickness has been completed, the dielectric layer containing hafnium oxide may be annealed to remove any residual nitrous oxide. To avoid the diffusion of oxygen during annealing to the semiconductor substrate surface, any annealing may be performed in an oxygen-free environment for short periods of time. An embodiment of an annealing environment may include a nitrogen atmosphere. In addition to avoiding oxygen diffusion to the semiconductor substrate, the relatively low temperatures employed by atomic layer deposition of a hafnium oxide dielectric layer allows for the formation of an amorphous hafnium oxide dielectric layer.

The thickness of a hafnium oxide layer is determined by a fixed growth rate for the pulsing periods and precursors used, set at a value such as N nm/cycle. For a desired hafnium oxide layer thickness, t, in an application such as forming a gate dielectric of a MOS transistor, the ALD process is repeated for t/N total cycles. Once the t/N cycles have completed, no further ALD processing for hafnium oxide is performed. In an embodiment, ALD processing provides for the engineering of a dielectric layer containing hafnium oxide having a dielectric constant in the range from about 8 to about 25.

At block 455, after forming the hafnium oxide, processing the device having the dielectric layer containing hafnium oxide is completed. In an embodiment, completing the device includes completing the formation of a transistor. In another embodiment, completing the device includes completing the formation of a capacitor. Alternately, completing the process includes completing the construction of a memory device having an array with access transistors formed with gate dielectrics containing atomic layer deposited hafnium oxide. In another embodiment, completing the process includes the formation of an electronic system including an information handling device that uses electronic devices with transistors formed with dielectric layers containing atomic layer deposited hafnium oxide. Typically, information handling devices such as computers include many memory devices, having many access transistors.

Upon reading and comprehending this disclosure, it can be appreciated by those skilled in the art that the elements of a method for forming an atomic layer deposited hafnium oxide layer in the embodiment of FIG. 4 may be performed under various other environmental conditions and pulse periods depending on the hafnium oxide layer to be formed for a given application and the system used to fabricate the hafnium oxide layer. Determination of the environmental conditions, precursors used, purging gases employed, and pulse periods for the precursors and purging gases may be made without undue experimentation.

Atomic layer deposition of a hafnium oxide dielectric layer may be processed in an atomic layer deposition system such as ALD system 200 under computer control to perform various embodiments, and operated under computer-executable instructions to perform these embodiments. In an embodiment, a computerized method and the computer-executable instructions for a method for forming a dielectric layer includes forming a layer of metal by atomic layer deposition, and forming on the layer of metal, by atomic layer deposition, a layer of an oxide of the metal. In another embodiment, a computerized method and the computer-executable instructions for a method for forming a dielectric layer include depositing a layer of hafnium by atomic layer deposition on a substrate surface by atomic layer deposition, and forming a layer of hafnium oxide, by atomic layer deposition, on the layer of hafnium metal.

In an embodiment, a computerized method and the computer-executable instructions for a method for forming a dielectric layer further includes forming the hafnium oxide dielectric layer by atomic layer deposition, where each precursor is pulsed into a reaction chamber for a predetermined period. The predetermined period is individually controlled for each precursor pulsed into the reaction chamber. Further, the substrate may be maintained at a selected temperature for each pulsing of a precursor, where the selected temperature is set independently for pulsing each precursor. In addition, each pulsing of a precursor is followed by purging the reaction chamber with a purging gas.

In an embodiment, a computerized method and the computer-executable instructions for a method for forming a dielectric layer may includes regulating the deposition of hafnium and hafnium oxide to form a dielectric layer having a dielectric constant in the range from about 8 to about 25.

In an embodiment, a computerized method and the computer-executable instructions for a method for forming a dielectric layer include controlling an environment of a reaction chamber. Additionally, the computerized method controls the pulsing of purging gases, one for each precursor gas and pulsing each purging gas after pulsing the associated precursor gas. Using a computer to control parameters for growing the dielectric layer provides for processing the dielectric layer over a wide range of parameters allowing for the determination of an optimum parameter set for the ALD system used. The computer-executable instructions may be provided in any computer-readable medium. Such computer-readable medium may include, but is not limited to, floppy disks, diskettes, hard disks, CD-ROMS, flash ROMS, non-volatile ROM, and RAM.

An embodiment of this method may be realized using ALD system 200 of FIG. 2A, where the controls for the individual elements of ALD system 200 are coupled to a computer, not shown in FIG. 2A. The computer provides control of the operation for processing a hafnium oxide dielectric layer by regulating the flow of precursor gases into reaction chamber 220. The computer controls the flow rate of precursor gases and the pulsing periods for these gases by controlling mass-flow controllers 256-259. Additionally, the computer controls the temperature of gas sources 251-254. Further, the pulse period and flow of purging gases from purging gas sources 261, 262 is regulated through computer control of mass-flow controllers 266, 267, respectively.

The computer also regulates the environment of reactor chamber 220 in which a dielectric layer is being formed on substrate 210. The computer regulates the pressure in reaction chamber 220 within a predetermined pressure range by controlling vacuum pumps 281, 282 through mass-flow controllers 286, 287, respectively. The computer also regulates the temperature range for substrate 210 within a predetermined range by controlling heater 230.

For convenience, the individual control lines to elements of ALD 200, as well as a computer, are not shown in FIG. 2A. The above description of the computer control in conjunction with FIG. 2A provides information for those skilled in the art to practice embodiments for forming a dielectric layer containing hafnium oxide using a computerized method as described herein.

The embodiments described herein provide a process for growing a dielectric layer having a wide range of useful equivalent oxide thickness, $t_{eq}$, associated with a dielectric constant in the range from about 8 to about 25. The $t_{eq}$ range in accordance with embodiments of the present subject matter are shown in the following:

| κ | Physical Thickness t = 1.0 nm (10 Å) $t_{eq}$ (Å) | Physical Thickness t = 2.5 nm (25 Å) $t_{eq}$ (Å) | Physical Thickness t = 5.0 nm (50 Å) $t_{eq}$ (Å) | Physical Thickness t = 10.0 nm (100 Å) $t_{eq}$ (Å) |
|---|---|---|---|---|
| 8 | 4.88 | 12.19 | 24.38 | 48.75 |
| 10 | 3.90 | 9.75 | 19.50 | 39.00 |
| 15 | 2.60 | 6.50 | 13.00 | 26.00 |
| 20 | 1.95 | 4.88 | 9.75 | 19.50 |
| 25 | 1.56 | 3.90 | 7.80 | 15.60 |

The relatively large dielectric constant for material layers of hafnium oxide allows for the engineering of dielectric layers having a physical thickness in the 10 nm (100 Å) range, while achieving a $t_{eq}$ of less than 5 nm (50 Å). From above, it is apparent that a layer containing hafnium oxide may be attained with a $t_{eq}$ ranging from about 1.5 Å to about 12 Å. Further, an atomic layer deposited hafnium oxide layer may provide a $t_{eq}$ significantly less than 2 or 3 Å, even less than 1.5 Å.

Attainment of a $t_{eq}$ in the monolayer thickness range is associated with an interfacial layer between a semiconductor substrate surface and the hafnium oxide dielectric layer that is exceptionally small or composed of a material having a dielectric constant approaching that of the hafnium oxide value. The formation of a $SiO_2$ interfacial layer should be avoided. Thus, the preparation of the semiconductor substrate surface prior to the first pulse of the first sequence of the ALD process should include removing any $SiO_2$ layer that may exist and preventing the formation of a $SiO_2$ prior to the beginning of the ALD process. Further, initial formation of a metal layer by ALD, such as forming a hafnium layer in an embodiment for a hafnium oxide dielectric layer, assists in the reduction or elimination of a $SiO_2$ interfacial layer. Forming the hafnium metal layer on the substrate prior to forming a hafnium oxide prevents oxygen from diffusing to the silicon surface during subsequent ALD formation of the hafnium oxide. As the hafnium oxide is being formed by ALD, oxygen that diffuses towards the silicon substrate interacts with the hafnium metal layer. In an embodiment, the hafnium layer substantially becomes hafnium oxide.

Hafnium metal at the interface with a silicon substrate may form a hafnium silicide as an interfacial layer between the silicon substrate and the hafnium oxide layer. This hafnium silicide interfacial layer though small reduces the effective dielectric constant for the dielectric layer disposed on the silicon substrate. However, the dielectric constant for the hafnium silicide is about 8, which is significantly higher than a silicon dioxide dielectric layer. Depending on the formation of the hafnium silicide and the thickness of this interfacial region, the dielectric constant for the hafnium oxide formed by atomic layer deposition of hafnium metal followed by atomic layer deposition of hafnium oxide ranges from about 8 to about 25.

Any micro-roughness associated with thin layers of hafnium oxide may be due to partial monolayer formation of the dielectric layer across the substrate surface. With some areas of the dielectric layer forming a monolayer in two or three cycles, while another area or region of the layer forms a monolayer in one or two cycles, the surface of the hafnium oxide dielectric layer may exhibit some micro-roughness. It is anticipated that the use of hafnium nitrate precursors assists in providing for uniform distribution across the substrate surface to help alleviate the occurrence of such micro-roughness of the dielectric layer. As can be understood by those skilled in the art, particular growth rates and processing conditions for providing a hafnium oxide dielectric layer with reduced or substantially eliminated micro-roughness may be determined during normal initial testing of the ALD system for processing a hafnium oxide dielectric layer for a given application without undue experimentation.

Further, dielectric layers of hafnium oxide formed by atomic layer deposition may provide not only ultra thin $t_{eq}$ layers, but also layers with relatively low leakage current. In addition to using ALD to provide precisely engineered layer thicknesses with engineered dielectric constants, good breakdown electric field properties, and relatively low leakage currents, ALD processing provides for dielectric layers that provide conformal layering on selected substrate surfaces.

Embodiments of processes described above for performing atomic layer deposition of hafnium oxide are used to precisely control the thickness of the dielectric layer formed, where, in addition to providing an ultra thin $t_{eq}$, the atomic layer deposition process provides for relatively smooth surfaces and limited interfacial layer formation. Additionally, these embodiments for ALD processing of dielectric layers, such as hafnium oxide dielectric layers, may be implemented to form transistors, capacitors, memory devices, and other electronic systems including electro-optic devices, microwave devices, and information handling devices. With careful preparation and engineering of the hafnium oxide layer, limiting the size of interfacial regions, a teq of about 5 Å to about 3 Å or lower for these devices is anticipated.

A transistor 100 as depicted in FIG. 1A may be formed by forming a source region 120 and a drain region 130 in a silicon based substrate 110 where source and drain regions 120, 130 are separated by a body region 132. Body region 132 defines a channel having a channel length 134. A dielectric layer is disposed on substrate 110 formed as a layer containing hafnium oxide on substrate 110 by atomic layer deposition. The resulting hafnium oxide dielectric layer forms gate dielectric 140.

A gate 150 is formed over gate dielectric 140. Typically, forming gate 150 may include forming a polysilicon layer, though a metal gate may be formed in an alternative process. Forming the substrate, the source and drain regions, and the gate is performed using standard processes known to those skilled in the art. Additionally, the sequencing of the various elements of the process for forming a transistor is conducted with standard fabrication processes, also as known to those skilled in the art.

Figure 5:
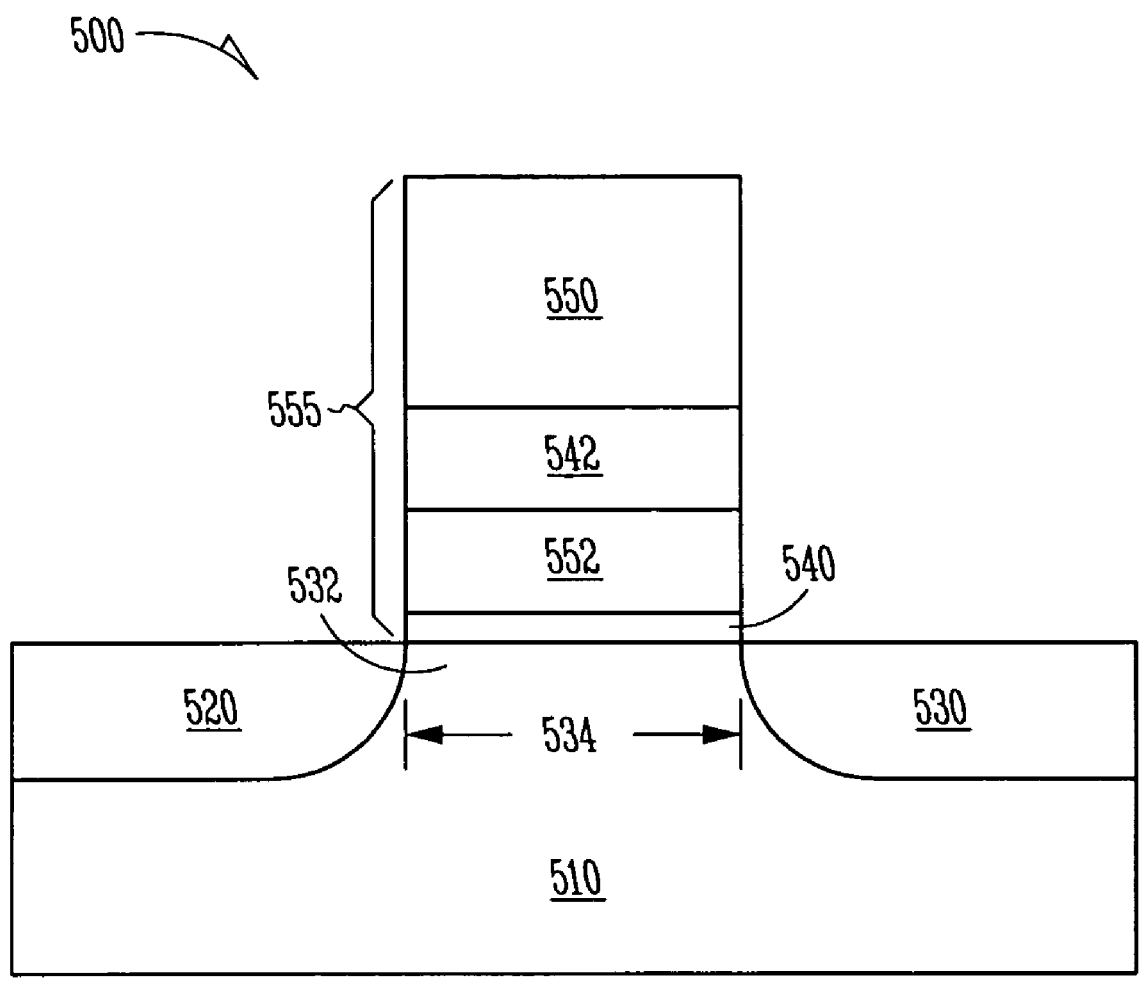
FIG. 5 shows an embodiment of a configuration of a transistor having an atomic layer deposited hafnium oxide dielectric layer, according to various embodiments of the present subject matter.

The method for forming an atomic layer deposited hafnium oxide in various embodiments may be applied to other transistor structures having dielectric layers. FIG. 5 shows an embodiment of a configuration of a transistor 500 having an atomic layer deposited hafnium oxide dielectric layer. Transistor 500 includes a silicon based substrate 510 with a source 520 and a drain 530 separated by a body region 532. Body region 532 between source 520 and drain 530 defines a channel region having a channel length 534. Located above body region 532 is a stack 555 including a gate dielectric 540, a floating gate 552, a floating gate dielectric 542, and a control gate 550. Gate dielectric 540 may be formed containing atomic layer deposited hafnium oxides described above with the remaining elements of the transistor 500 formed using processes known to those skilled in the art. Alternately, both gate dielectric 540 and floating gate dielectric 542 may be formed as dielectric layers containing hafnium oxide in various embodiments as described herein.

The embodiments of methods for forming hafnium oxide dielectric layers may also be applied to forming capacitors in various integrated circuits, memory devices, and electronic systems. In an embodiment for forming a capacitor, a method includes forming a first conductive layer, forming a dielectric layer containing hafnium oxide on the first conductive layer by atomic layer deposition, and forming a second conductive layer on the dielectric layer. ALD formation of the hafnium oxide dielectric layer allows the dielectric layer to be engineered within a predetermined composition providing a desired dielectric constant.

Figure 6:
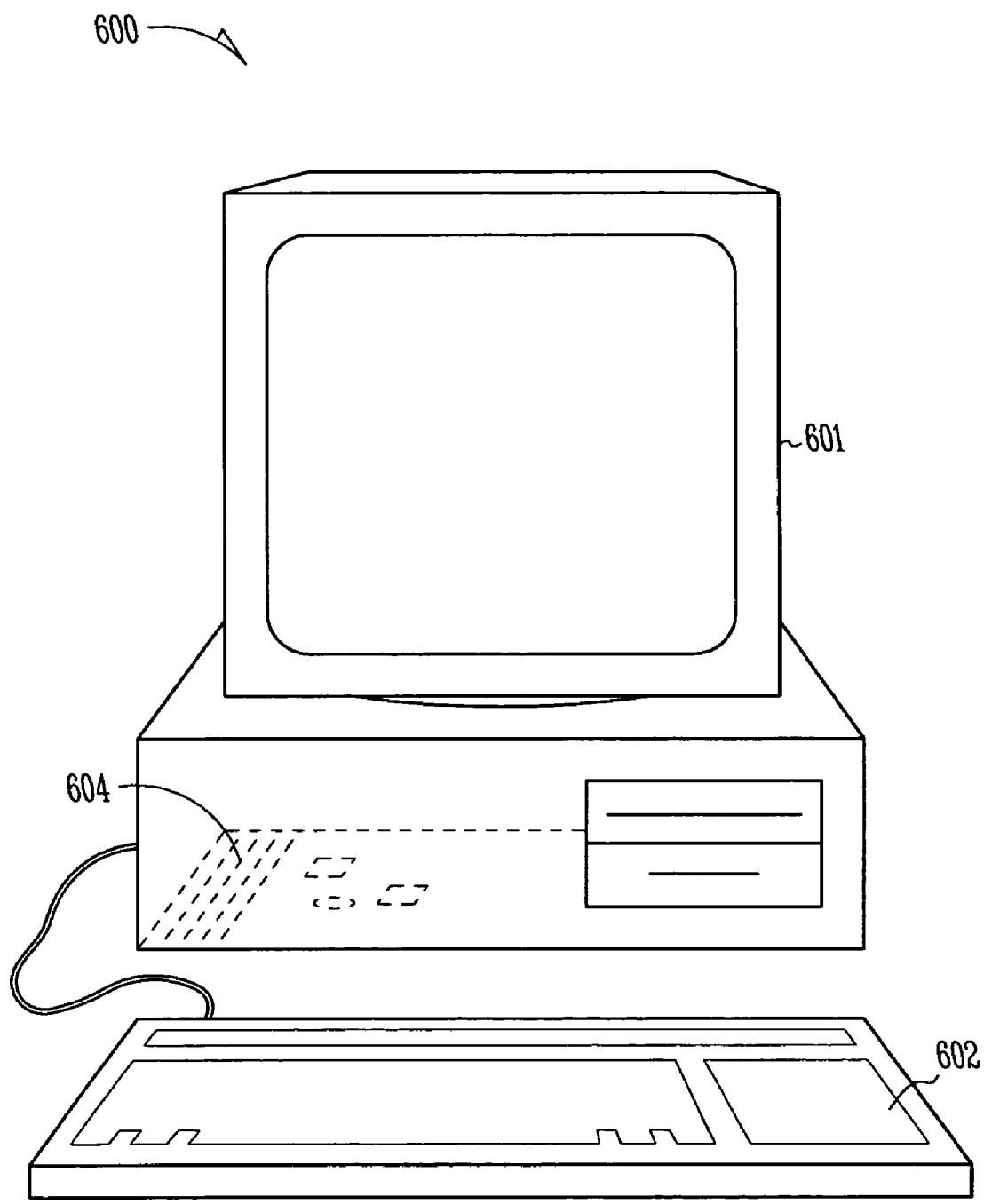
FIG. 6 shows an embodiment of a personal computer incorporating devices having an atomic layer deposited dielectric layer, according to various embodiments of the present subject matter.
Figure 7:
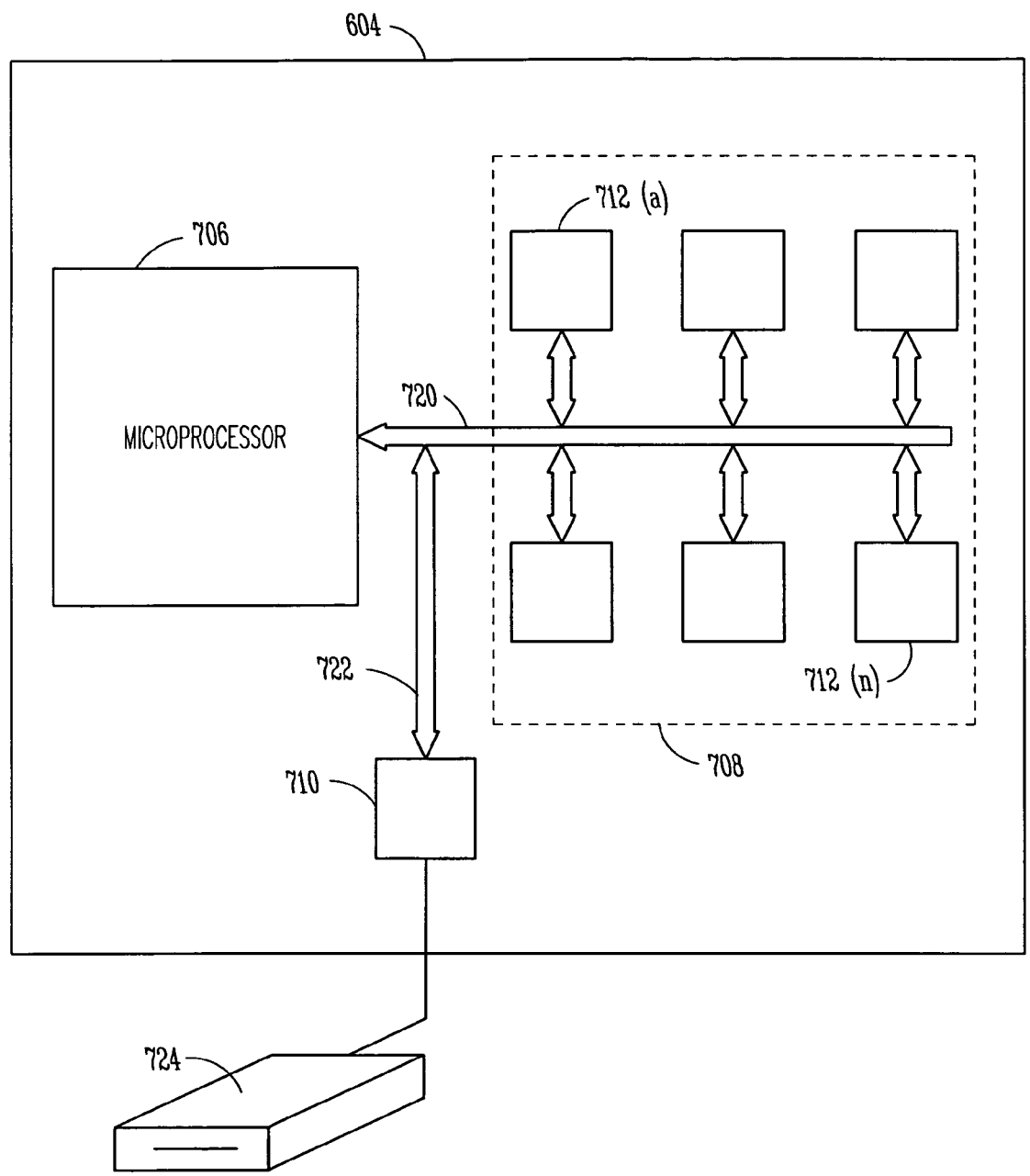
FIG. 7 illustrates a schematic view of an embodiment of a central processing unit incorporating devices having an atomic layer deposited dielectric layer, according to various embodiments of the present subject matter.
Figure 8:
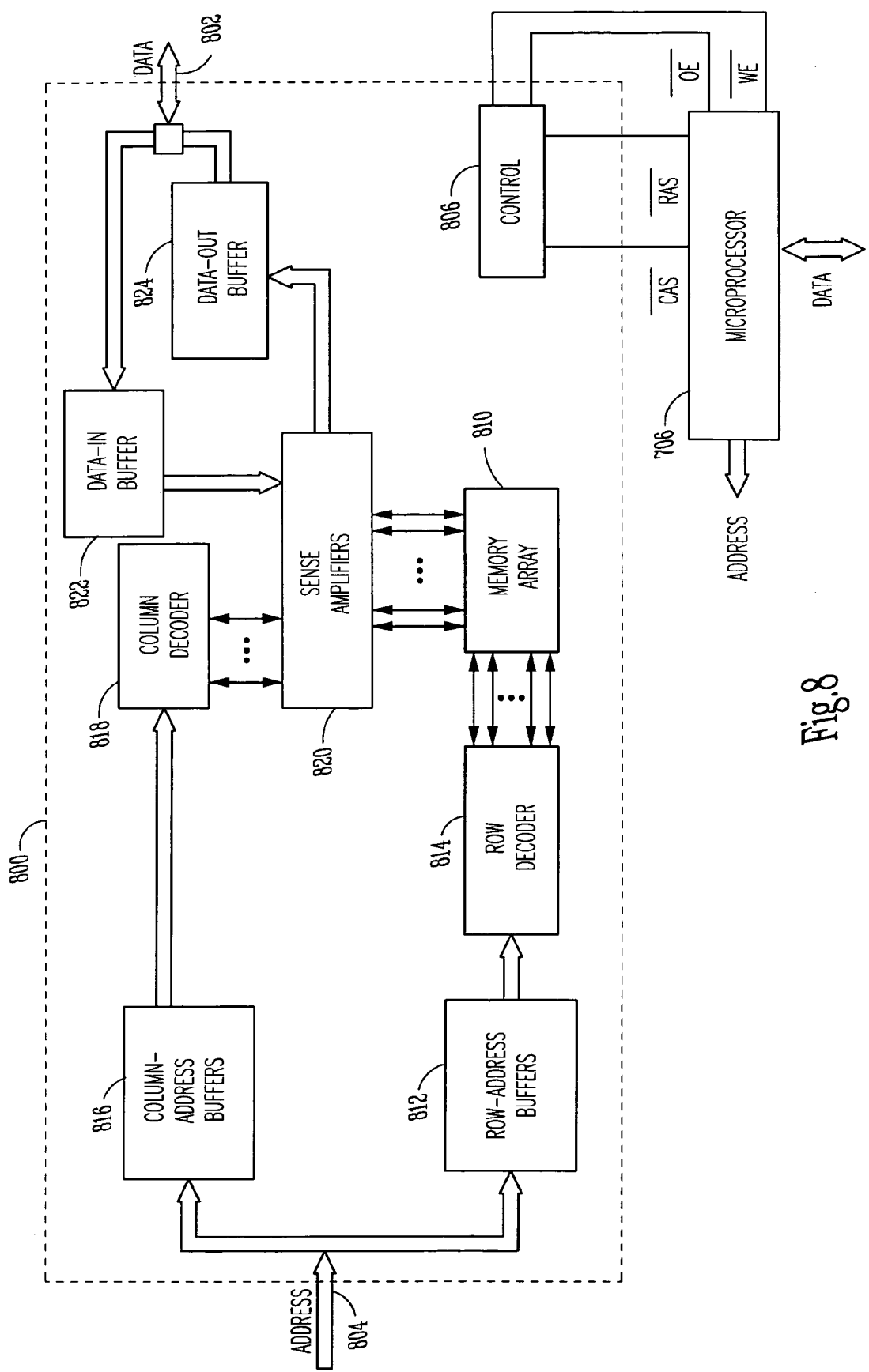
FIG. 8 illustrates a schematic view of an embodiment of a DRAM memory device having an atomic layer deposited dielectric layer, according to various embodiments of the present subject matter.

Transistors, capacitors, and other devices having dielectric layers, such as hafnium oxide dielectric layers, formed by atomic layer deposition using methods described herein may be implemented into memory devices and electronic systems including information handling devices. Such information devices may include wireless systems, telecommunication systems, and computers. An embodiment of a computer having a dielectric layer, such as a hafnium oxide dielectric layer, formed by atomic layer deposition using methods described herein is shown in FIGS. 6-8 and described below. While specific types of memory devices and computing devices are shown below, it will be recognized by one skilled in the art that several types of memory devices and electronic systems including information handling devices utilize the present subject matter.

A personal computer 600, as shown in FIGS. 6 and 7, may include a monitor 601, keyboard input 602 and a central processing unit 604. Central processor unit 604 typically may include microprocessor 706, memory bus circuit 708 having a plurality of memory slots 712(a-n), and other peripheral circuitry 710. Peripheral circuitry 710 permits various peripheral devices 724 to interface processor-memory bus 720 over input/output (I/O) bus 722. The personal computer shown in FIGS. 6 and 7 also includes at least one transistor having a dielectric layer, such as a hafnium oxide dielectric layer, formed by atomic layer deposition using methods described herein according an embodiment of the present subject matter.

Microprocessor 706 produces control and address signals to control the exchange of data between memory bus circuit 708 and microprocessor 706 and between memory bus circuit 708 and peripheral circuitry 710. This exchange of data is accomplished over high speed memory bus 720 and over high speed I/O bus 722.

Coupled to memory bus 720 are pluralities of memory slots 712(a-n), which receive memory devices well known to those skilled in the art. For example, single in-line memory modules (SIMMs) and dual in-line memory modules (DIMMs) may be used in the implementation of embodiment of the present subject matter.

These memory devices may be produced in a variety of designs that provide different methods of reading from and writing to the dynamic memory cells of memory slots 712. One such method is the page mode operation. Page mode operations in a DRAM are defined by the method of accessing a row of a memory cell arrays and randomly accessing different columns of the array. Data stored at the row and column intersection may be read and output while that column is accessed. Page mode DRAMs use access steps, which limit the communication speed of memory circuit 708.

An alternate type of device is the extended data output (EDO) memory, which allows data stored at a memory array address to be available as output after the addressed column has been closed. This memory may increase some communication speeds by allowing shorter access signals without reducing the time in which memory output data is available on memory bus 720. Other alternative types of devices include SDRAM, DDR SDRAM, SLDRAM and Direct RDRAM as well as others such as SRAM or Flash memories.

FIG. 8 illustrates a schematic view of an embodiment of a DRAM memory device 800 having an atomic layer deposited dielectric layer formed according to an embodiment described herein. Illustrative DRAM memory device 800 is compatible with memory slots 712(a-n). The description of DRAM memory device 800 has been simplified for purposes of illustrating a DRAM memory device and is not intended to be a complete description of all the features of a DRAM. Those skilled in the art will recognize that a wide variety of memory devices may be used in the implementation of embodiments of the present subject matter. The embodiment of a DRAM memory device shown in FIG. 8 includes at least one transistor having a dielectric layer, such as a hafnium oxide dielectric layer, formed by atomic layer deposition using methods described herein according to the teachings of the present subject matter.

Control, address and data information provided over memory bus 720 is further represented by individual inputs to DRAM 800, as shown in FIG. 8. These individual representations are illustrated by data lines 802, address lines 804 and various discrete lines directed to control logic 806.

As is well known in the art, DRAM 800 includes memory array 810, which in turn comprises rows and columns of addressable memory cells. Each memory cell in a row is coupled to a common word line. The word line is coupled to gates of individual transistors, where at least one transistor has a gate coupled to a gate dielectric, such as a hafnium oxide dielectric layer, formed by atomic layer deposition in accordance with the method and structure previously described above. Additionally, each memory cell in a column is coupled to a common bit line. Each cell in memory array 810 may include a storage capacitor and an access transistor as is conventional in the art.

DRAM 800 interfaces with, for example, microprocessor 706 through address lines 804 and data lines 802. Alternatively, DRAM 800 may interface with a DRAM controller, a micro-controller, a chip set or other electronic system. Microprocessor 706 also provides a number of control signals to DRAM 800, including but not limited to, row and column address strobe signals RAS and CAS, write enable signal WE, an output enable signal OE and other conventional control signals.

Row address buffer 812 and row decoder 814 receive and decode row addresses from row address signals provided on address lines 804 by microprocessor 706. Each unique row address corresponds to a row of cells in memory array 810. Row decoder 814 may include a word line driver, an address decoder tree, and circuitry which translates a given row address received from row address buffers 812 and selectively activates the appropriate word line of memory array 810 via the word line drivers.

Column address buffer 816 and column decoder 818 receive and decode column address signals provided on address lines 804. Column decoder 818 also determines when a column is defective and the address of a replacement column. Column decoder 818 is coupled to sense amplifiers 820. Sense amplifiers 820 are coupled to complementary pairs of bit lines of memory array 810.

Sense amplifiers 820 are coupled to data-in buffer 822 and data-out buffer 824. Data-in buffers 822 and data-out buffers 824 are coupled to data lines 802. During a write operation, data lines 802 provide data to data-in buffer 822. Sense amplifier 820 receives data from data-in buffer 822 and stores the data in memory array 810 as a charge on a capacitor of a cell at an address specified on address lines 804.

During a read operation, DRAM 800 transfers data to microprocessor 706 from memory array 810. Complementary bit lines for the accessed cell are equilibrated during a precharge operation to a reference voltage provided by an equilibration circuit and a reference voltage supply. The charge stored in the accessed cell is then shared with the associated bit lines. A sense amplifier of sense amplifiers 820 detects and amplifies a difference in voltage between the complementary bit lines. The sense amplifier passes the amplified voltage to data-out buffer 824.

Control logic 806 is used to control the many available functions of DRAM 800. In addition, various control circuits and signals not detailed herein initiate and synchronize DRAM 800 operation as known to those skilled in the art. As stated above, the description of DRAM 800 has been simplified for purposes of illustrating an embodiment of the present subject matter and is not intended to be a complete description of all the features of a DRAM. Those skilled in the art will recognize that a wide variety of memory devices, including but not limited to, SDRAMs, SLDRAMs, RDRAMs and other DRAMs and SRAMs, VRAMs and EEPROMs, may be used in the implementation of embodiments of the present subject matter. The DRAM implementation described herein is illustrative only and not intended to be exclusive or limiting.

CONCLUSION

A dielectric layer, such as a hafnium oxide dielectric layer, formed by atomic layer deposition using methods described herein produce a reliable dielectric layer having an equivalent oxide thickness thinner than attainable using $SiO_2$. Dielectric layers containing atomic layer deposited hafnium oxide formed using the methods described herein are thermodynamically stable such that the dielectric layers formed will have minimal reactions with a silicon substrate or other structures during processing.

Forming hafnium oxide layers by atomic layer deposition in relatively low processing temperatures allows for hafnium oxide layers that are amorphous and conformally layered on a substrate surface. Further, the ALD formation of a hafnium oxide dielectric layer provides for enhanced dielectric and electrical properties relative to those attained with an amorphous $SiO_x$ layer. These properties of layers containing atomic layer deposited hafnium oxide layers allow for application as dielectric layers in numerous electronic devices and systems.

Capacitors, transistors, electro-optic devices, higher level ICs or devices, and electronic systems are constructed utilizing various embodiments of the process for forming a dielectric layer having an ultra thin equivalent oxide thickness, $t_{eq}$. Gate dielectric layers or layers containing atomic layer deposited hafnium oxide are formed having a dielectric constant substantially higher than that of silicon oxide, where the dielectric layers are capable of a $t_{eq}$ thinner than 10 Å, thinner than the expected limit for $SiO_2$ gate dielectrics. The thinner $t_{eq}$ of these dielectric layers allows for a higher capacitance than $SiO_2$ gate dielectrics, which provides further effective scaling for microelectronic devices and systems. At the same time, the physical thickness of the atomic layer deposited hafnium oxide dielectric layer is much larger than the $SiO_2$ thickness associated with the $t_{eq}$ limit of $SiO_2$. Forming the larger thickness aids in the manufacturing process for gate dielectrics and other dielectric layers. Further, a hafnium oxide layer processed in relatively low temperatures allowed by atomic layer deposition provides amorphous dielectric layers having relatively low leakage current for use as dielectric layers in electronic devices and systems.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of the present subject matter. It is to be understood that the above description is intended to be illustrative, and not restrictive. Combinations of the above embodiments, and other embodiments will be apparent to those of skill in the art upon reviewing the above description. The scope of the present subject matter includes any other applications in which the above structures and fabrication methods are used. The scope of the present subject matter should be determined with reference to the appended claims, along with the full scope of equivalents to which such claims are entitled.

What is claimed is:

1. An electronic device comprising:
   a silicon substrate;
   a dielectric layer disposed on the silicon substrate; the dielectric layer having a dielectric film structured as one or more monolayers of a metal oxide, the dielectric film having a surface with a roughness less than or equal to a micro-roughness due to partial monolayer formation of the dielectric film, the dielectric layer having an interfacial layer, the interfacial layer in contact with the silicon substrate essentially without a $SiO_x$ layer contacting the silicon substrate.

2. The electronic device of claim 1, wherein the dielectric layer includes an amorphous hafnium oxide layer.

3. The electronic device of claim 1, wherein the dielectric layer includes a hafnium oxide layer substantially free of silicon oxide.

4. The electronic device of claim 1, wherein the electronic device includes a hafnium silicide layer as the interfacial layer.

5. The electronic device of claim 1, wherein the dielectric layer has an equivalent oxide thickness less than or equal to 12 Å.

6. The electronic device of claim 1, wherein the dielectric layer is a capacitor dielectric of a capacitor.

7. The electronic device of claim 1, wherein the dielectric layer is a gate dielectric of a transistor.

8. The electronic device of claim 1, wherein the dielectric layer is a dielectric layer in a memory.

9. The electronic device of claim 1, wherein the electronic device includes conductive paths to a conductive layer contacting the dielectric layer to provide a signal to the conductive layer from devices in an electronic system.

10. A capacitor, comprising:
    a first conductive layer on a silicon substrate;
    a dielectric layer disposed on the first conductive layer, the dielectric layer disposed on the silicon substrate, the dielectric layer having a dielectric film structured as one or more monolayers of a metal oxide, the dielectric film having a surface with a roughness less than or equal to a micro-roughness due to partial monolayer formation of the dielectric film, the dielectric layer having an interfacial layer, the interfacial layer contacting the first conductive layer essentially without a $SiO_x$ layer contacting the first conductive layer; and
    a second conductive layer disposed on the dielectric layer.

11. The capacitor of claim 10, wherein the metal oxide includes hafnium.

12. The capacitor of claim 11, wherein the interfacial layer is structured by forming a layer of hafnium on the first conductive layer by atomic layer deposition including performing a number of cycles ranging from 4 to 10 cycles to deposit the layer of hafnium on the substrate and forming hafnium oxide on the layer of hafnium to substantially convert the layer of hafnium to hafnium oxide.

13. The capacitor of claim 10, wherein the dielectric layer has a dielectric constant in the range from about 8 to about 25.

14. A transistor comprising:
a silicon body region between a source region and a drain region on a silicon substrate;
a dielectric layer disposed on the silicon body region between the source region and the drain region, the dielectric layer having a dielectric film structured as one or more monolayers of a metal oxide, the dielectric film having a surface with a roughness less than or equal to a micro-roughness due to partial monolayer formation of the dielectric film, the dielectric layer having an interfacial layer, the interfacial layer contacting the silicon body region essentially without a $SiO_x$ layer contacting the silicon body region; and
a gate coupled to the dielectric layer.

15. The transistor of claim 14, wherein the metal oxide includes hafnium.

16. The transistor of claim 15, wherein the interfacial layer is structured by forming a layer of hafnium on the body region by atomic layer deposition including performing a number of cycles ranging from 4 to 10 cycles to deposit the layer of hafnium on the body region and forming hafnium oxide on the layer of hafnium to substantially convert the layer of hafnium to hafnium oxide.

17. The transistor of claim 15, wherein the dielectric layer has a dielectric constant in the range from about 8 to about 25.

18. The transistor of claim 15, wherein the dielectric layer has an equivalent oxide thickness ($t_{eq}$) equal to or less than 10 Angstroms.

19. A memory comprising:
a number of access transistors, at least one access transistor including a gate coupled to a dielectric layer, the dielectric layer disposed on a silicon body region between a source region and a drain region on a silicon substrate, the dielectric layer having a dielectric film structured as one or more monolayers of a metal oxide, the dielectric film having a surface with a roughness less than or equal to a micro-roughness due to partial monolayer formation of the dielectric film, the dielectric layer having an interfacial layer, the interfacial layer contacting the silicon body region essentially without a $SiO_x$ layer contacting the body region;
a number of word lines coupled to the number of access transistors; and
a number of bit lines coupled to the number of access transistors.

20. The memory of claim 19, wherein the metal oxide includes hafnium.

21. The memory of claim 20, wherein the interfacial layer is structured by forming a layer of hafnium on the body region by atomic layer deposition including performing a number of cycles ranging from 4 to 10 cycles to deposit the layer of hafnium on the body region and forming hafnium oxide on the layer of hafnium to substantially convert the layer of hafnium to hafnium oxide.

22. The memory of claim 20, wherein the dielectric layer has a dielectric constant in the range from about 8 to about 25.

23. The memory of claim 20, wherein the dielectric layer has an equivalent oxide thickness (teq) equal to or less than 12 Angstroms.

24. An electronic system comprising:
a processor;
a system bus; and
a memory coupled to the processor by the system bus, the memory including:
a number of access transistors, at least one access transistor including a gate coupled to a dielectric layer, the dielectric layer disposed on a silicon body region between a source region and a drain region on a silicon substrate, the dielectric layer having a dielectric film structured as one or more monolayers of a metal oxide, the dielectric film having a surface with a roughness less than or equal to a micro-roughness due to partial monolayer formation of the dielectric film, the dielectric layer having an interfacial layer, the interfacial layer contacting the silicon body region essentially without a $SiO_x$ layer contacting the silicon body region;
a number of word lines coupled to the number of access transistors; and
a number of bit lines coupled to the number of access transistors.

25. The electronic system of claim 24, wherein the metal oxide includes hafnium.

26. The electronic system of claim 25, wherein the interfacial layer is structured by forming a layer of hafnium on the body region by atomic layer deposition including performing a number of cycles ranging from 4 to 10 cycles to deposit the layer of hafnium on the body region and forming hafnium oxide on the layer of hafnium to substantially convert the layer of hafnium to hafnium oxide.

27. The electronic system of claim 25, wherein the dielectric layer has a dielectric constant in the range from about 8 to about 25.

28. The electronic system of claim 25, wherein the dielectric layer has an equivalent oxide thickness ($t_{eq}$) equal to or less than 12 Angstroms.

* * * * *

UNITED STATES PATENT AND TRADEMARK OFFICE
CERTIFICATE OF CORRECTION

PATENT NO. : 7,405,454 B2 Page 1 of 1
APPLICATION NO. : 11/213013
DATED : July 29, 2008
INVENTOR(S) : Ahn et al.

It is certified that error appears in the above-identified patent and that said Letters Patent is hereby corrected as shown below:

On the title page, item (56), under "U.S. Patent Documents", in column 1, line 3, delete "Otter et al." and insert -- Otter, Jr. et al. --, therefor.

In column 1, line 17, delete ""Methods," and insert -- "Methods --, therefor.

In column 22, line 13, in Claim 23, delete "(teq)" and insert -- $(t_{eq})$ --, therefor.

Signed and Sealed this

Seventh Day of October, 2008

JON W. DUDAS
*Director of the United States Patent and Trademark Office*